(12) United States Patent  (10) Patent No.: US 9,121,901 B2
Kiyokawa et al.  (45) Date of Patent: Sep. 1, 2015

(54) SEMICONDUCTOR WAFER TEST APPARATUS

(75) Inventors: Toshiyuki Kiyokawa, Saitama (JP); Takashi Naito, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 760 days.

(21) Appl. No.: 13/148,971

(22) PCT Filed: Feb. 12, 2009

(86) PCT No.: PCT/JP2009/052302
§ 371 (c)(1), (2), (4) Date: Aug. 11, 2011

(87) PCT Pub. No.: WO2010/092672
PCT Pub. Date: Aug. 19, 2010

(65) Prior Publication Data
US 2011/0316571 A1   Dec. 29, 2011

(51) Int. Cl.
*G01R 31/00* (2006.01)
*G01R 31/28* (2006.01)
*H01L 21/683* (2006.01)

(52) U.S. Cl.
CPC ........ *G01R 31/2893* (2013.01); *G01R 31/2891* (2013.01); *H01L 21/683* (2013.01)

(58) Field of Classification Search
CPC ............ H01L 21/683; H01L 21/67333; G01R 31/2601
USPC .................................................... 324/750.16
See application file for complete search history.

(56) References Cited

U.S. PATENT DOCUMENTS

| 5,510,724 | A | * | 4/1996 | Itoyama et al. | 324/750.05 |
|---|---|---|---|---|---|
| 5,614,837 | A | * | 3/1997 | Itoyama et al. | 324/750.05 |
| 5,798,651 | A | * | 8/1998 | Aruga et al. | 324/750.25 |
| 6,333,636 | B1 | * | 12/2001 | Kim | 324/750.16 |
| 6,586,956 | B2 | * | 7/2003 | Aldaz et al. | 324/750.16 |
| 6,791,347 | B2 | * | 9/2004 | Ishizaka et al. | 324/750.05 |
| 6,992,500 | B2 | | 1/2006 | Sugiyama et al. | |
| 7,332,918 | B2 | | 2/2008 | Sugiyama et al. | |
| 2002/0190740 | A1 | * | 12/2002 | Ishizaka et al. | 324/761 |
| 2004/0227536 | A1 | | 11/2004 | Sugiyama et al. | |

(Continued)

FOREIGN PATENT DOCUMENTS

| CN | 1565054 | 1/2005 |
|---|---|---|
| JP | 2694462 | 9/1997 |

(Continued)

OTHER PUBLICATIONS

Japan Office action, mail date is Aug. 6, 2013.

(Continued)

*Primary Examiner* — Jermele M Hollington
*Assistant Examiner* — Christopher McAndrew
(74) *Attorney, Agent, or Firm* — Greenblum & Bernstein, P.L.C.

(57) ABSTRACT

An apparatus includes a plurality of test heads to which probe cards are electrically connected; a wafer tray which is able to hold a semiconductor wafer; and an alignment apparatus which positions the semiconductor wafer held on the wafer tray relatively with respect to the probe card so as to make the wafer tray face the probe card. The wafer tray has a pressure reducing mechanism which pulls the wafer tray toward the probe card. The alignment apparatus is configured to be able to move along the array direction of the test heads.

11 Claims, 29 Drawing Sheets

(56) References Cited

U.S. PATENT DOCUMENTS

| | | | |
|---|---|---|---|
| 2006/0033519 A1 | 2/2006 | Sugiyama et al. | |
| 2007/0057683 A1* | 3/2007 | Abe | 324/754 |
| 2008/0284455 A1 | 11/2008 | Obikane et al. | |
| 2008/0290886 A1 | 11/2008 | Akiyama et al. | |
| 2009/0039908 A1* | 2/2009 | Ikeuchi et al. | 324/754 |
| 2009/0085594 A1 | 4/2009 | Yamamoto et al. | |
| 2010/0134134 A1* | 6/2010 | Grover et al. | 324/763 |

FOREIGN PATENT DOCUMENTS

| | | |
|---|---|---|
| JP | 11-067855 | 3/1999 |
| JP | 11-121549 | 4/1999 |
| JP | 2004-140296 | 5/2004 |
| JP | 2007-294362 | 4/2006 |
| JP | 2007-294632 | 11/2007 |
| JP | 2008-177562 | 7/2008 |
| JP | 2008-182061 | 8/2008 |
| JP | 2008-311618 | 12/2008 |
| TW | 200406862 | 5/2004 |
| WO | 2009/004968 | 1/2009 |

OTHER PUBLICATIONS

China Office action, mail date is Feb. 5, 2013.
Korea Office action, mail date is Feb. 21, 2013.
Taiwan Office action, mail date is Apr. 30, 2013.

* cited by examiner

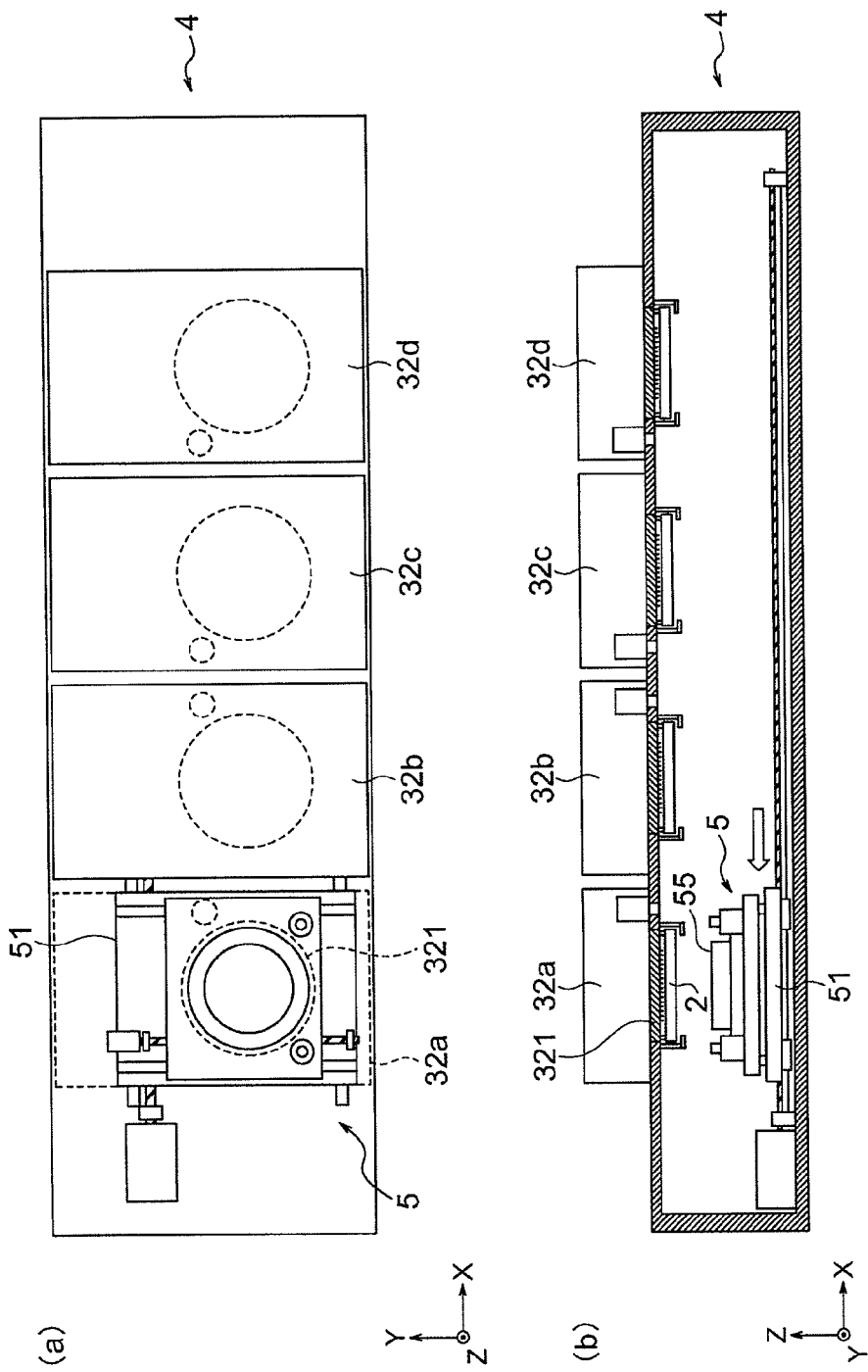

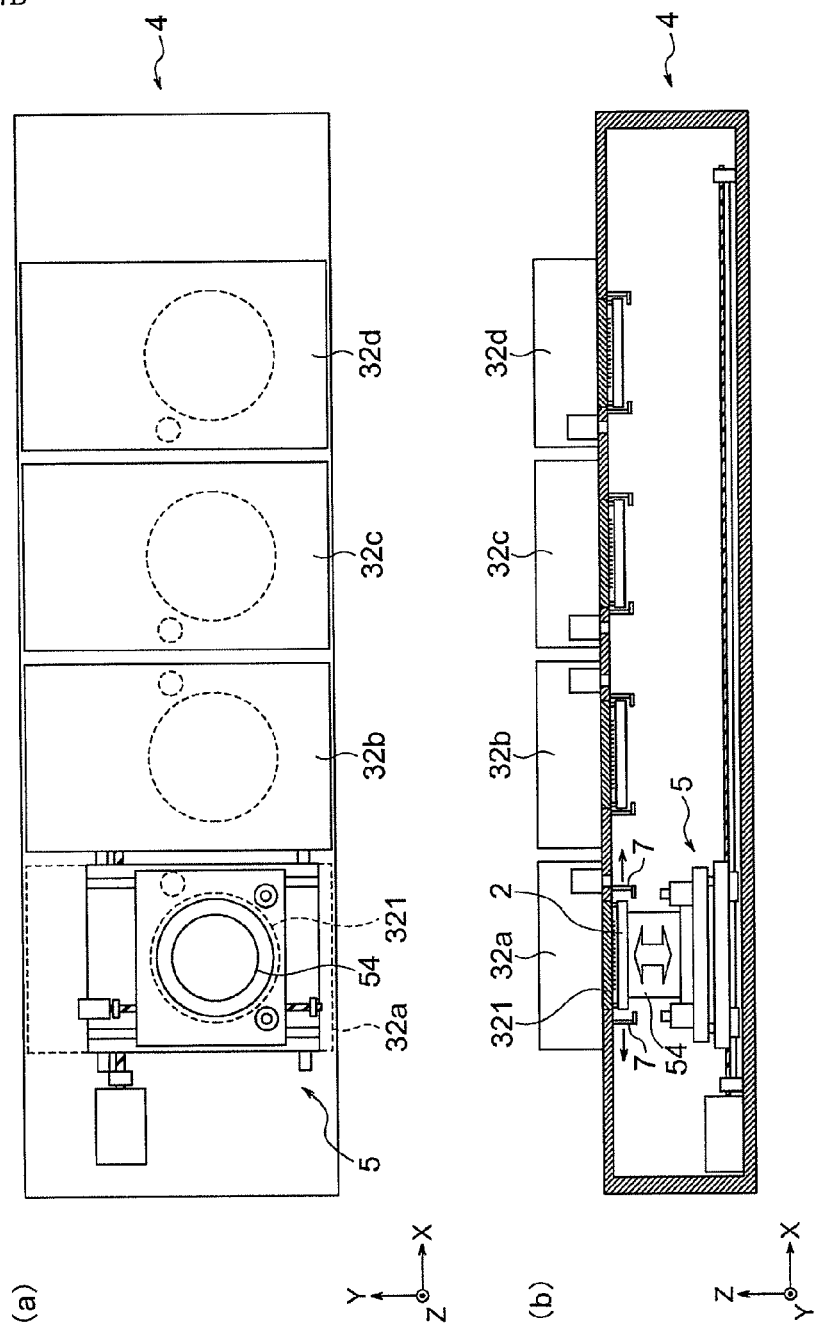

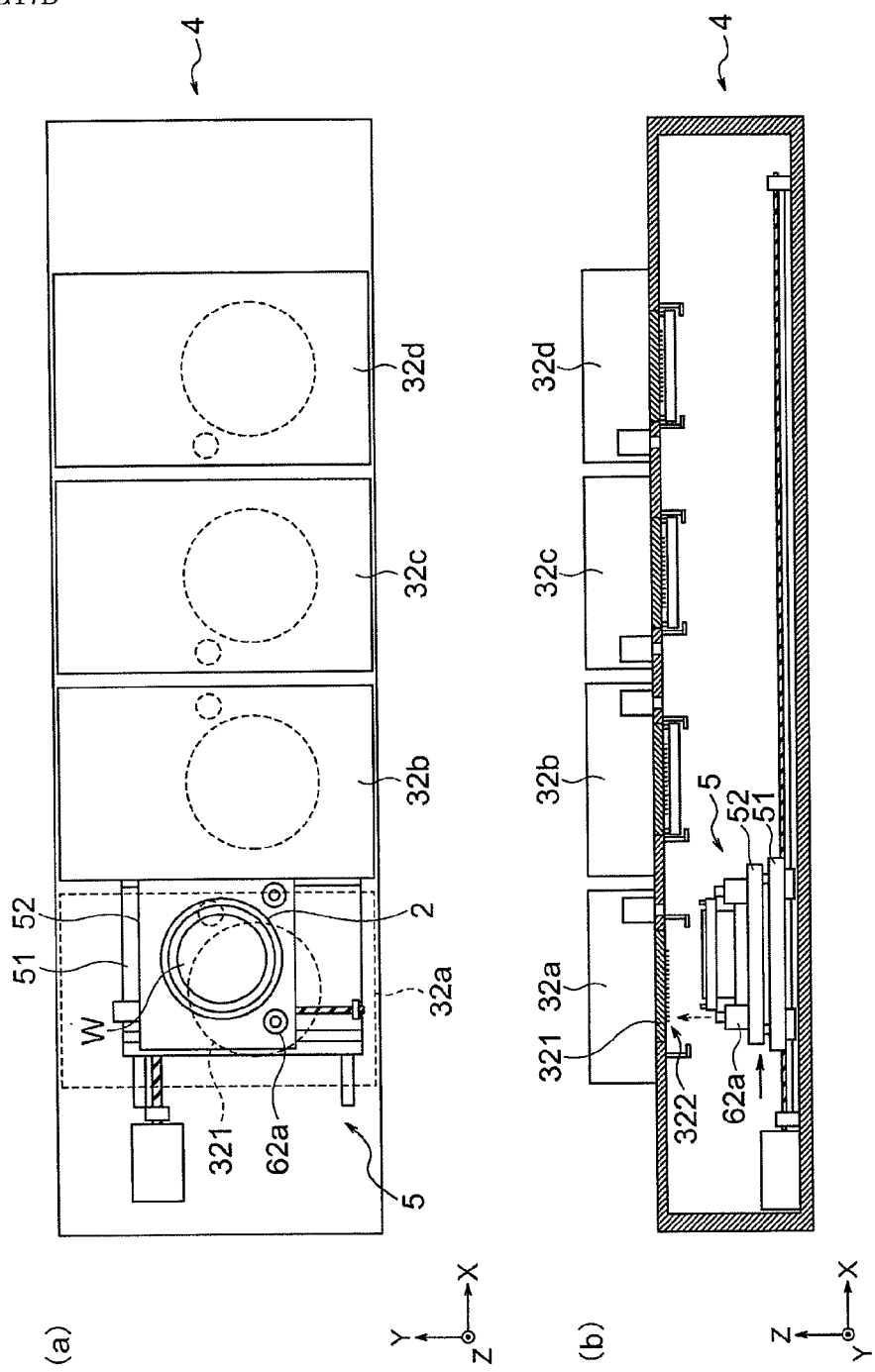

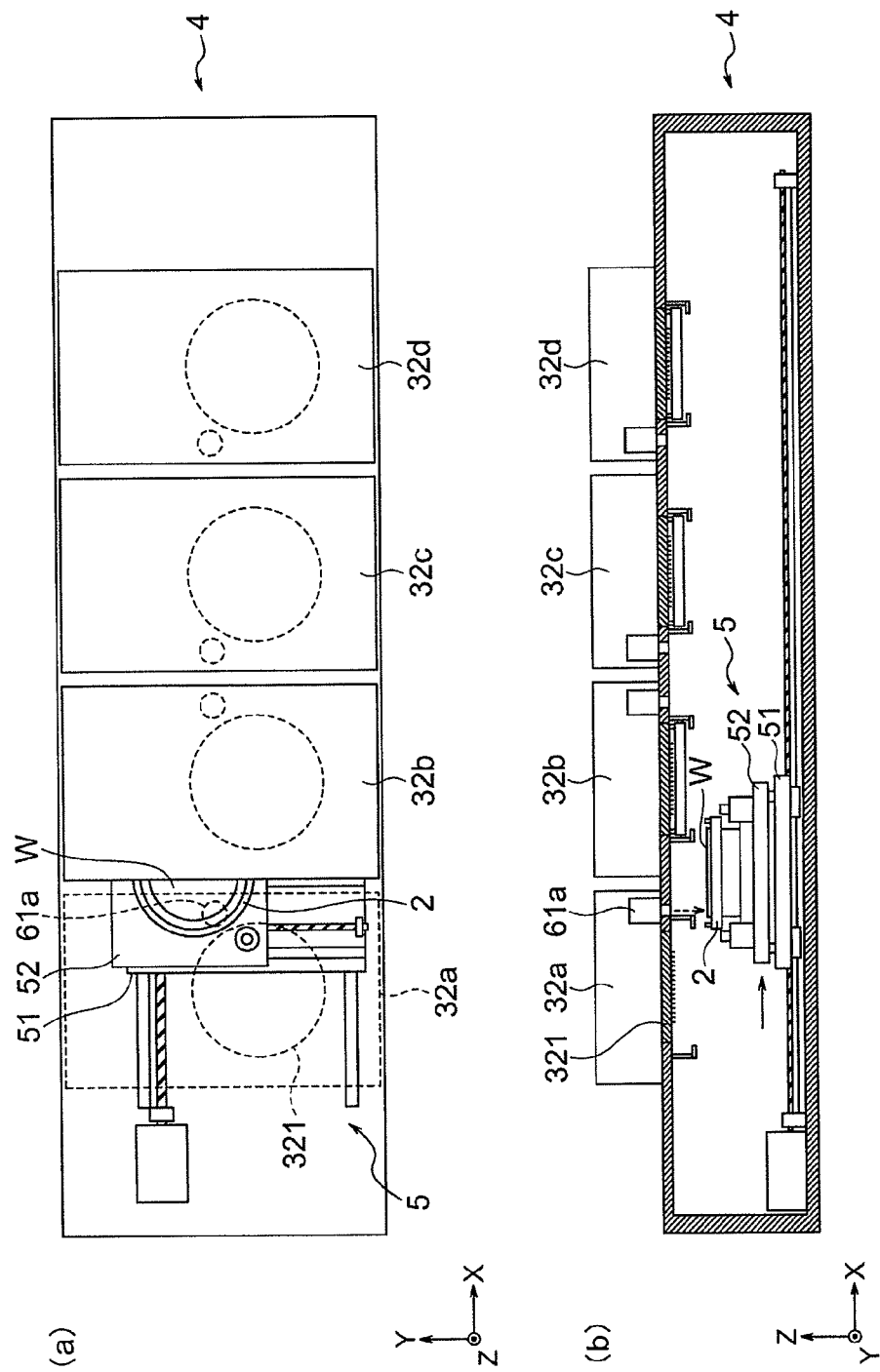

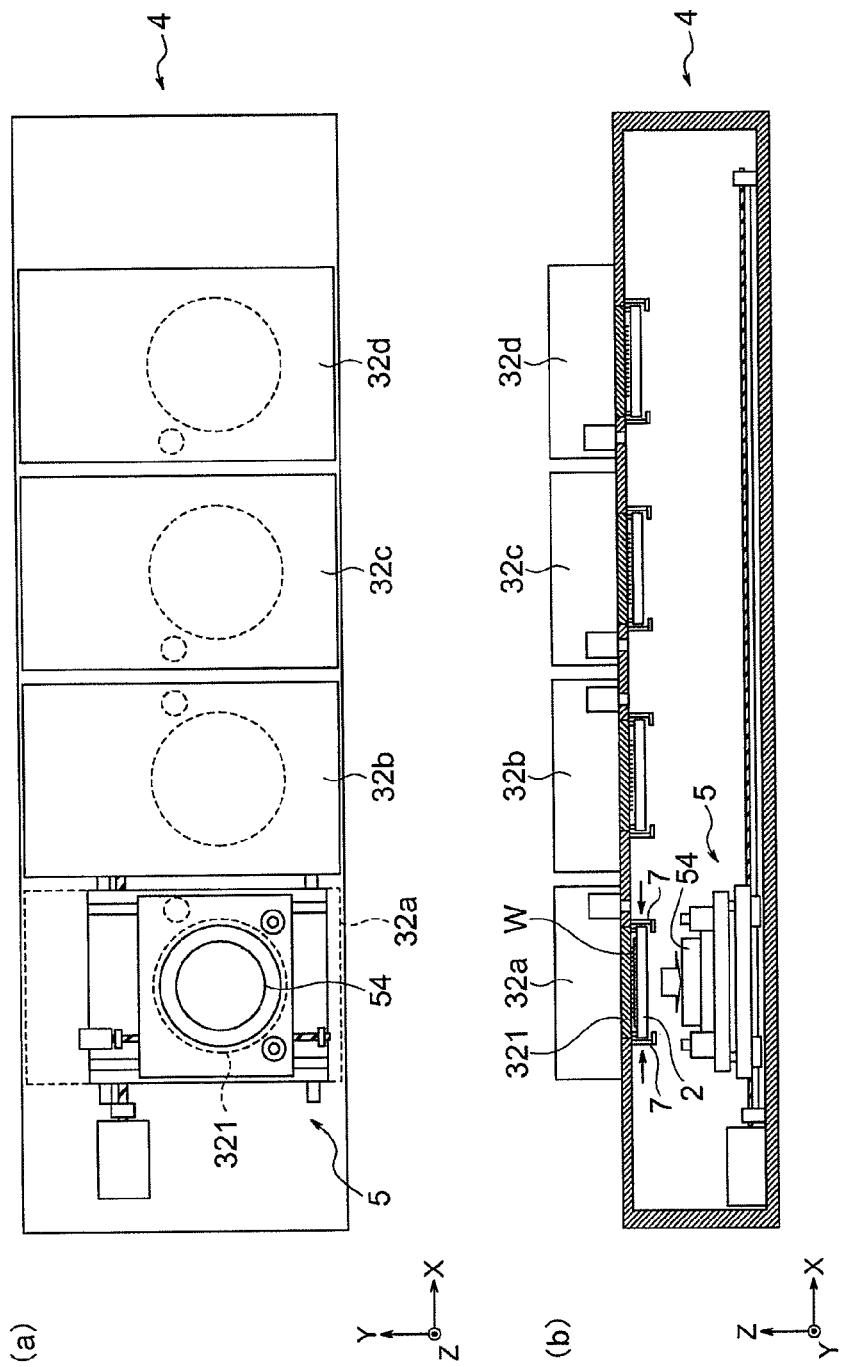

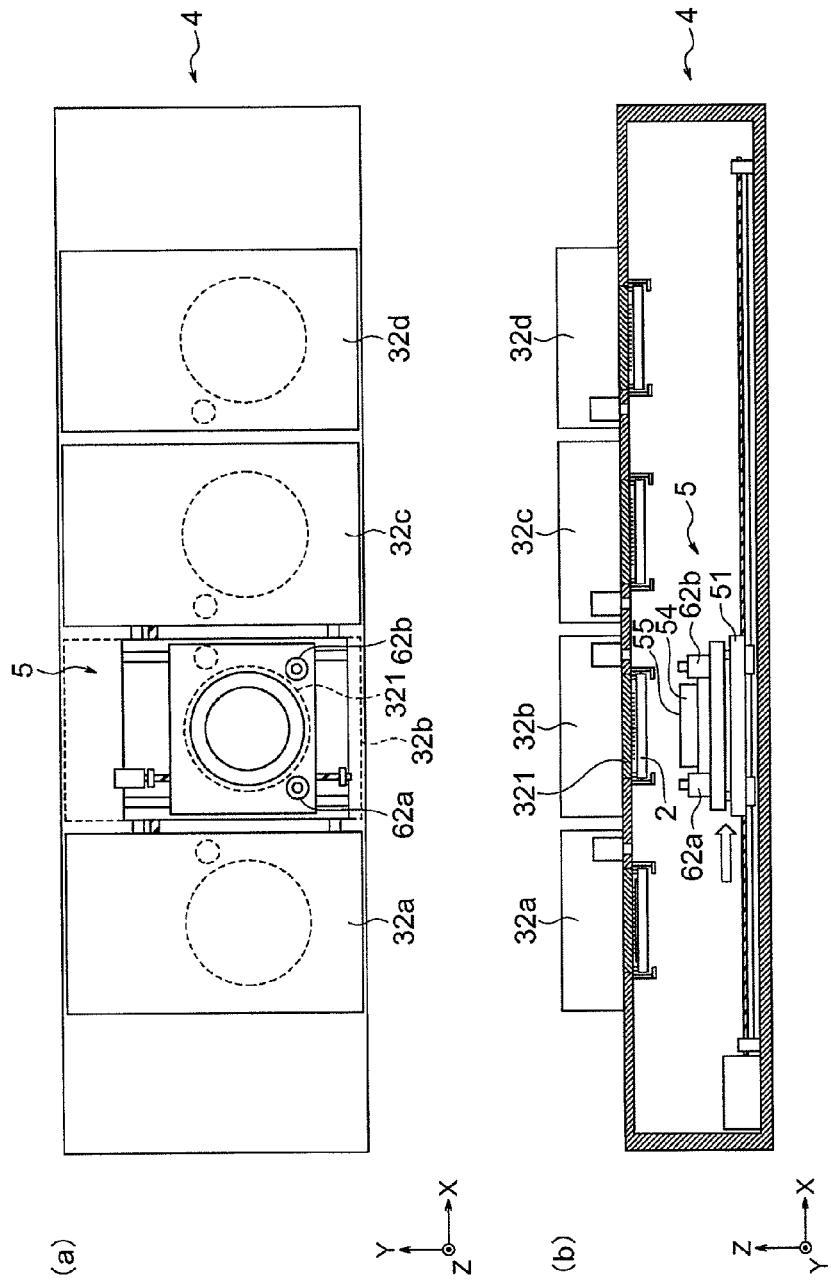

SEMICONDUCTOR WAFER TEST APPARATUS

TECHNICAL FIELD

The present invention relates to a semiconductor wafer test apparatus for testing integrated circuits or other electronic circuits formed on a semiconductor wafer.

BACKGROUND ART

Known in the art is a semiconductor wafer test apparatus which positions a semiconductor wafer, which is held by suction on a wafer table, with respect to a probe card by a wafer table drive mechanism, then pushes that semiconductor wafer against the probe card by the wafer table drive mechanism (for example, see PLT 1).

PLT 1: Japanese Patent No. 2694462

DISCLOSURE OF INVENTION

Technical Problem

When conducting a plurality of tests, a plurality of the above semiconductor wafer test apparatuses become necessary, so there were the problems that a large space became required and the cost became higher.

The problem to be solved by the present invention is the provision of a semiconductor wafer test apparatus which enables reduction of space and lower cost.

Technical Solution

According to the present invention, there is provided a semiconductor wafer test apparatus characterized by comprising: a plurality of test heads to which probe cards are electrically connected; a wafer tray which is able to hold a semiconductor wafer; an alignment means which positions the semiconductor wafer held on the wafer tray relatively with respect to the probe card so as to make the wafer tray face the probe card; and a pulling means which pulls the wafer tray facing the probe card toward the probe card, wherein the alignment means has: a positioning mechanism which positions the semiconductor wafer relative to the probe card; and a movement mechanism which moves the positioning mechanism along an array direction of the test heads.

In the above invention, the alignment means may have an elevating mechanism which moves the wafer tray up and down.

In the above invention, the apparatus may comprises a top plate on which a plurality of mounting holes open, the probe cards may be mounted in the mounting holes, and the pulling means may have: a holder which holds the wafer tray; and a pulling mechanism which is provided around the mounting hole on the top plate and which pulls the holder toward the top plate.

In the above invention, the pulling means may have a hole enlargement mechanism which is able to enlarge a passage hole surrounded by the holders to a size through which the wafer tray can pass.

Further, in the above invention, the wafer tray may have projecting parts which stick out in a diametrical direction, a passage hole which has recessed parts corresponding to the projecting parts and through which the wafer tray can pass may be formed on the holder, and the wafer tray may rotate relative to the holder such that the holder holds the wafer tray.

In the above invention, the pulling means may have: a sealing means which seals a space between the wafer tray and the probe card; and a pressure reducing means which reduces the pressure in the space.

In the above invention, the apparatus may comprises a plurality of the wafer trays, and the plurality of wafer trays may have temperature regulating means which are able to mutually independently heat and/or cool semiconductor wafers.

In the above invention, the apparatus may comprise one or more first image capturing means each of which captures an image of the semiconductor wafer.

In the above invention, the plurality of the first image capturing means may be respectively provided adjoining the probe cards, and a first image capturing means which is positioned at an end in the array direction of the test heads among the plurality of the first image capturing means may be arranged at an inside from the probe card.

In the above invention, the apparatus may comprises one or more second image capturing means each of which is provided at the alignment means in order to capture an image of the probe card.

Further, in the above invention, the plurality of the second image capturing means may be arranged at both sides of the wafer tray which is held by the alignment means in the array direction of the test heads.

In the above invention, the apparatus may comprises a conveying means which conveys the semiconductor wafer to the wafer tray which is held by the alignment means.

In the above invention, the apparatus may comprises a storing means which is able to store the semiconductor wafer, and the conveying means may convey the semiconductor wafer between the storing means and the alignment means.

In the above invention, the alignment means may move the wafer tray which faces the probe card so as to face another probe card.

Advantageous Effects of Invention

In the present invention, a single semiconductor wafer test apparatus comprises a plurality of test heads and is able to run a plurality of tests, so reduction of space can be promoted.

Further, in the present invention, the alignment means is configured to be able to move along the array direction of the test heads, so the plurality of test heads can share the alignment means and the cost of the semiconductor wafer test apparatus can be reduced.

BRIEF DESCRIPTION OF THE DRAWINGS

FIG. 17A is a view showing operation of a semiconductor wafer test apparatus in a first embodiment of the present invention (part 1).

FIG. 17B is a view showing operation of a semiconductor wafer test apparatus in a first embodiment of the present invention (part 2).

FIG. 17D is a view showing operation of a semiconductor wafer test apparatus in a first embodiment of the present invention (part 4).

FIG. 17F is a view showing operation of a semiconductor wafer test apparatus in a first embodiment of the present invention (part 6).

FIG. 17K is a view showing operation of a semiconductor wafer test apparatus in a first embodiment of the present invention (part 10).

FIG. 17L is a view showing operation of a semiconductor wafer test apparatus in a first embodiment of the present invention (part 11).

REFERENCE SIGNS LIST

Figure 1:
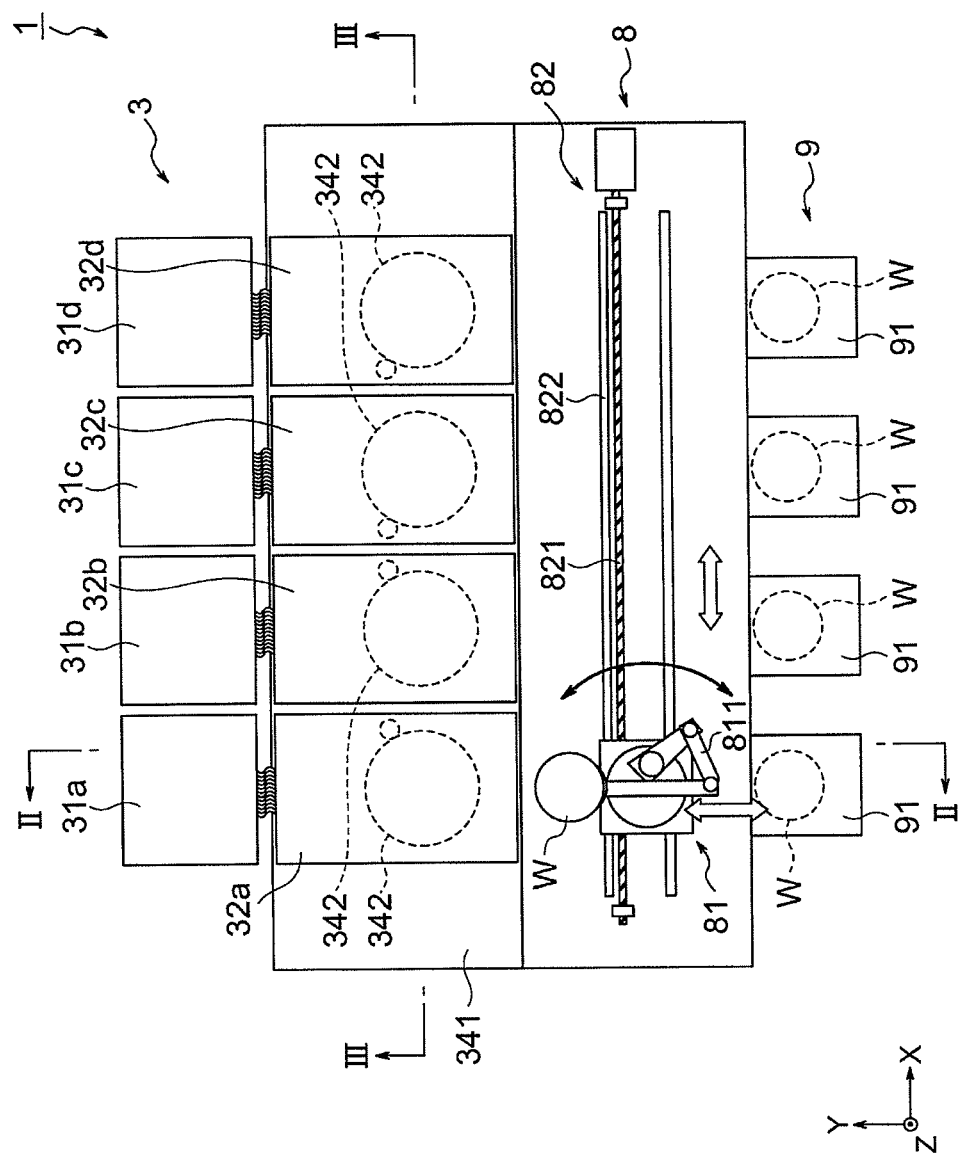
FIG. 1 is a plan view showing a semiconductor wafer test apparatus in a first embodiment of the present invention.

1 . . . semiconductor wafer test apparatus
2 . . . wafer tray
  21 . . . tray body
    212 . . . ring-shaped groove
    213 . . . pressure suction passage
    214 . . . pressure reduction passage
    216 . . . cooling passage
  22 . . . seal member
  25 . . . heater
  26 . . . temperature sensor
  27 . . . sealed space
  281, 282 . . . vacuum pumps
  29 . . . chiller
3 . . . test unit
  31a to 31d . . . tester
  32a to 32d . . . test heads
    321 . . . probe card
    322 . . . contact terminal
  33 . . . frame
    341 . . . top plate
    342 . . . mounting hole
4 . . . positioning unit
5 . . . alignment apparatus
  51 . . . X-direction movement mechanism
  52 . . . Y-direction movement mechanism
  53 . . . rotation mechanism
  54 . . . elevating mechanism
  55 . . . tray holding surface
  61a to 61d . . . first image capturing device
  62a, 62b . . . second image capturing device
7 . . . support device
8 . . . conveyor unit
  81 . . . conveyor robot
  82 . . . horizontal movement device
9 . . . storage unit
  91 . . . FOUP
W . . . semiconductor wafer

BEST MODE FOR CARRYING OUT THE INVENTION

Below, a first embodiment of the present invention will be explained based on the drawings.

Figure 2:
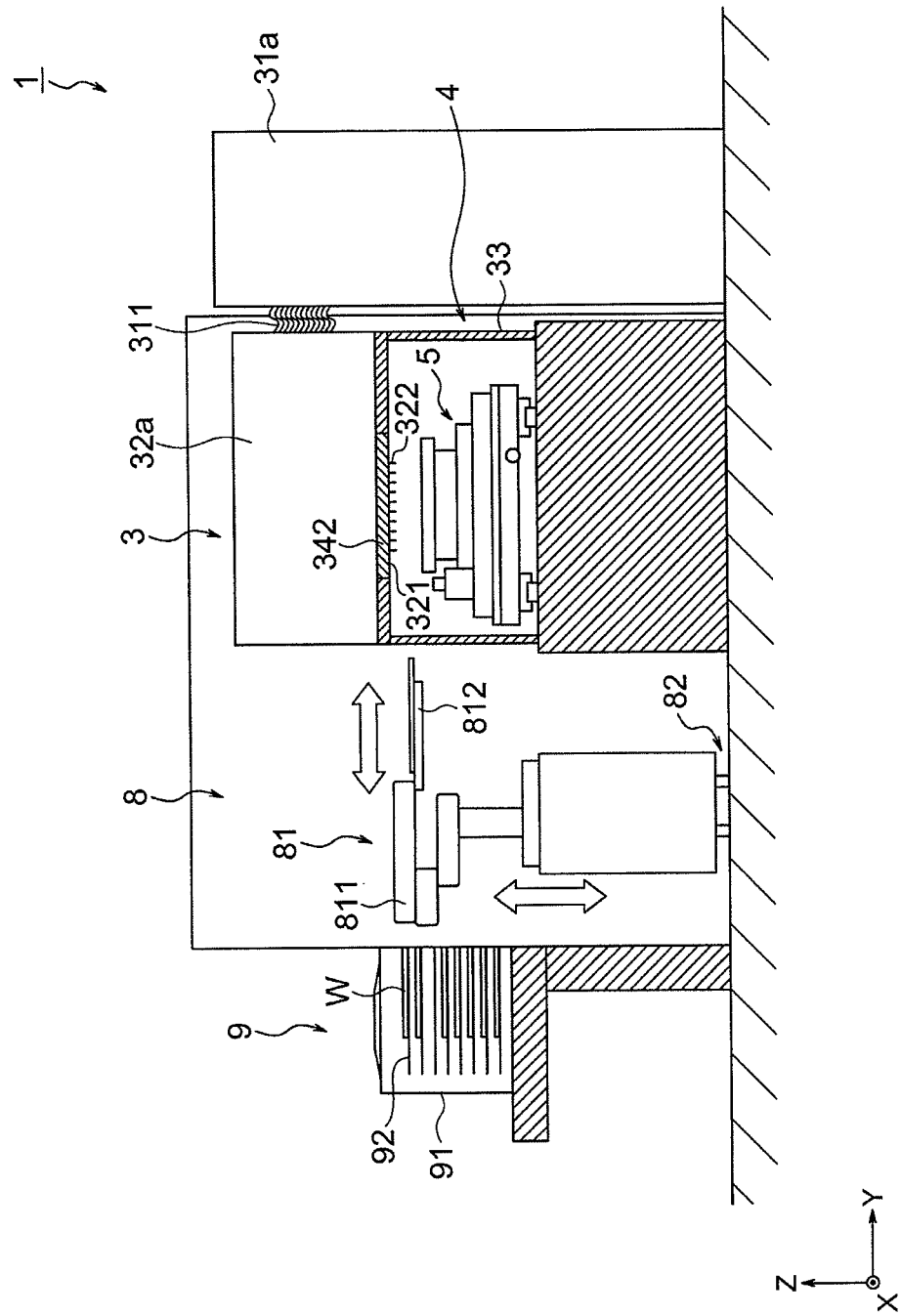
FIG. 2 is a cross-sectional view along the line II-II of FIG. 1.
Figure 3:
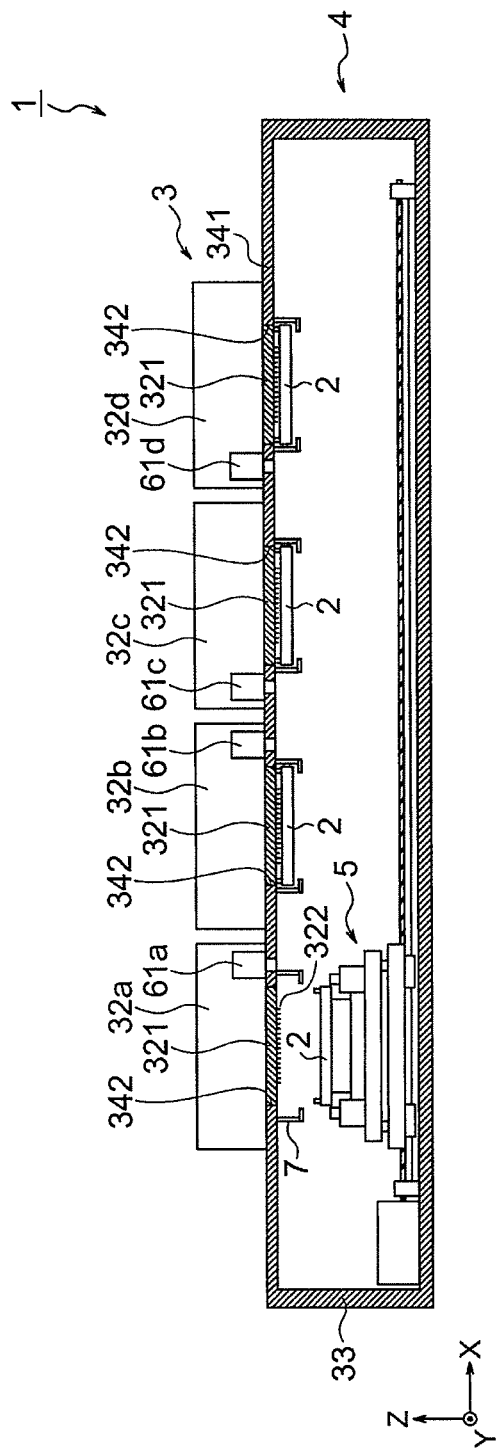
FIG. 3 is a cross-sectional view along the line III-III of FIG. 1.

FIG. 1 is a plan view showing a semiconductor wafer test apparatus in the present invention, FIG. 2 is a cross-sectional view along the line II-II of FIG. 1, and FIG. 3 is a cross-sectional view along the line of FIG. 1.

The semiconductor wafer test apparatus 1 in the present embodiment is a apparatus for testing electronic circuits which are formed on a semiconductor wafer W. As shown in FIG. 1 to FIG. 3, the apparatus comprises a test unit 3, a positioning unit 4, a conveyor unit 8, and a storage unit 9.

The test unit 3, as shown in FIG. 1 to FIG. 3, has: four testers 31a to 31d which input test signals to the semiconductor wafers W and diagnose output signals from the semiconductor wafers W; four test heads 32a to 32d which electrically relay signals between the semiconductor wafers W and the testers 31a to 31d; and a frame 32 which supports the test heads 32a to 32d. In this test unit 3, the semiconductor wafers W are brought into electrical contact with the probe cards 321 of the test heads 32a to 32d. In that state, the testers 31a to 31d run tests on the electronic circuits of the semiconductor wafers W through the test heads 32a to 32d.

The test heads 32a to 32d are electrically connected to the testers 31a to 31d through cables 311 and are electrically connected to the probe cards 321 against which the semiconductor wafers W are pushed. The probe card 321 comprises large numbers of contact terminals 322 which contact electrode pads of electronic circuits of the semiconductor wafer W. As specific examples of the contact terminals 322, for example, pogo pins or needles mounted on the boards or bumps formed on membranes etc. may be illustrated.

The frame 33 has an internal space which is able to accommodate the positioning unit 4 and has at its top a top plate 341 which is covered by the test heads 32a to 32d. This top plate 341 is formed with mounting holes 342 into which the probe cards 321 are mounted. In the present embodiment, the top plate 341 has four mounting holes 342 arranged along the X-direction.

The probe card 321 is mounted in the mounting hole 342 so that the contact terminals 322 face the inside of the positioning unit 4. In the present embodiment, the probe cards 321 are respectively mounted in the four mounting holes 342, so four test heads 32a to 32d align on the top plate 341.

Note that, the test heads are not particularly limited in number and layout. For example, it is also possible to arrange a plurality of test heads along the X-direction and Y-direction in a matrix. Incidentally, in this case, in the present invention, the movement mechanism moves the positioning mechanism along the X-direction and Y-direction (array directions of test heads). Further, the plurality of test heads may also be arranged in a circular shape. In this case, in the present invention, the movement mechanism moves the positioning mechanism along a circumferential direction (array direction of test heads).

The positioning unit 4 has an alignment apparatus 5, first image capturing devices 61a to 61d, second image capturing devices 62a, 62b, and support devices 7.

Figure 4:
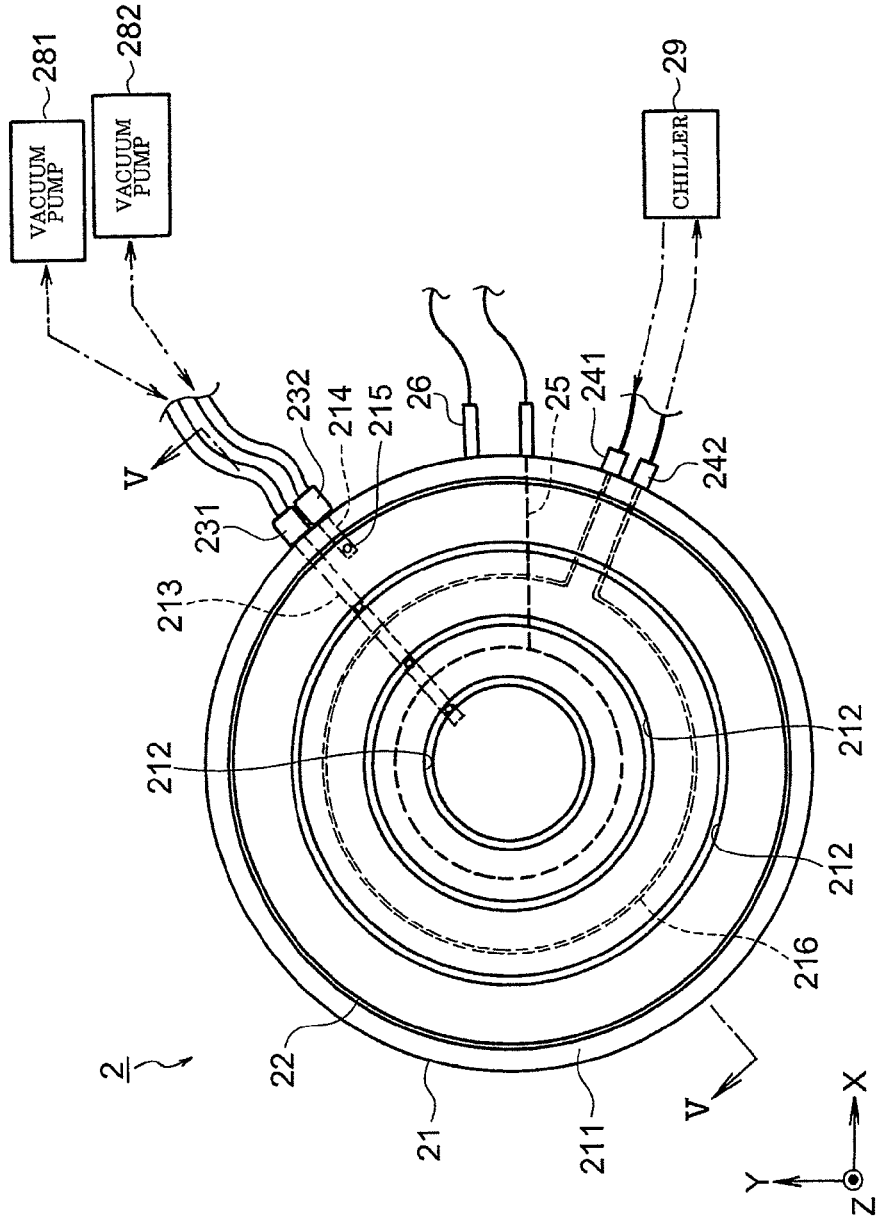
FIG. 4 is a plan view of a wafer tray of a semiconductor wafer test apparatus shown in FIG. 1.

Note that, the semiconductor wafer W is handled in the positioning unit 4 using the wafer tray 2, so first the configuration of that wafer tray 2 will be explained. FIG. 4 is a plan view of a wafer tray in the present embodiment, while FIG. 5 is a cross-sectional view along the line V-V of FIG. 4.

Figure 5:
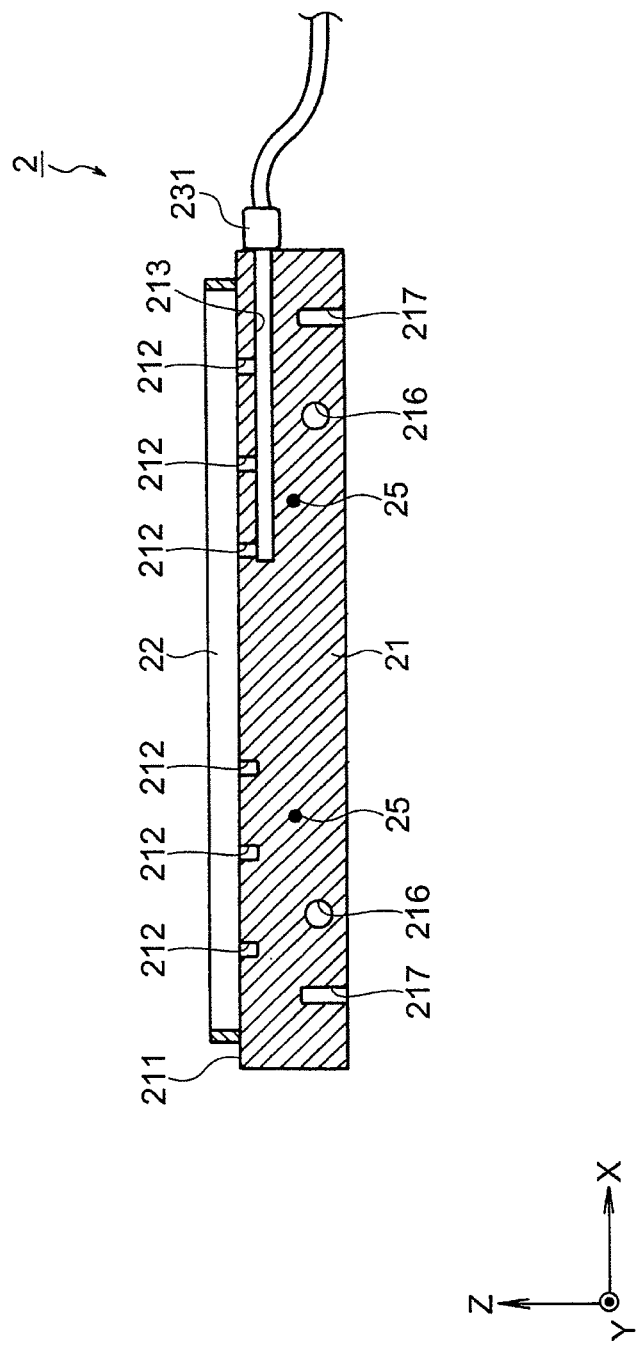
FIG. 5 is a cross-sectional view along the line V-V of FIG. 4.

As shown in FIG. 4 and FIG. 5, the wafer tray 2 has a disk-shaped tray body 21 composed of for example alumina ($Al_2O_3$) or aluminum or copper or another metal material.

Three ring-shaped grooves 212 are formed on the main surface 211 of this tray body 21 in concentric circular shapes. These ring-shaped grooves 212 are communicated with a pressure suction passage 213 which is formed inside the tray body 21. Further, this pressure suction passage 213 is connected through a pressure suction port 231 to a vacuum pump 281. When the vacuum pump 281 is used to provide suction in the state with the semiconductor wafer W placed on the tray body 21, the negative pressure which is generated inside the ring-shaped grooves 212 is used to hold the semiconductor wafer W on the wafer tray 20 by suction.

Further, a pressure reduction passage 214 is formed inside the tray body 21. This pressure reduction passage 214 opens on the main surface 211 at a suction hole 215 which is located at the outer circumferential side from the ring-shaped grooves 212. This pressure reduction passage 214 is connected through a pressure reduction port 232 to a vacuum pump 282.

Further, a ring-shaped seal member 22 is provided near the outer circumference of the main surface 211 of the tray body 21. As a specific example of this seal member 22, for example, a packing composed of silicone rubber may be illustrated. When the wafer tray 2 is pressed against a probe card 321, this seal member 22 is used to form a sealed space 27 between the tray body 21 and the probe card 321 (see FIG. 17J). Furthermore, in this state, the inside of the sealed space 27 is evacuated by the vacuum pump 282 through the pressure reduction passage 214 and suction hole 215, whereby the wafer tray 2 is pulled toward the probe card 321 and, as a result, the semiconductor wafer W which is held on that tray 2 is pushed against the probe card 2. Note that, the sealed space 27 may also be reduced in pressure from the probe card 321 side.

Furthermore, a heater 25 is buried inside the tray body 21 for heating the semiconductor wafer W, and a cooling passage 216 is formed inside the tray body 21 for circulating coolant. This cooling passage 216 is connected through cooling ports 241, 242 to a chiller 29. As specific examples of the coolant, for example, a fluorine-based inert liquid (for example, Fluorinert (registered trademark) made by 3M) or other liquid with excellent electrical insulating properties may be illustrated. Note that, instead of the heater 25, it is also possible to circulate a heating fluid through a passage formed inside of the tray body 21 so as to heat the semiconductor wafer W. Further, when just heating the semiconductor wafer W, it is sufficient to bury only the heater 25 in the tray body 21. On the other hand, when just cooling the semiconductor wafer W, it is sufficient to just form the cooling passage 216 in the tray body 21.

Further, a temperature sensor 26 is buried in the tray body 21 for directly or indirectly measuring the temperature of the semiconductor wafer W. By using the results of measurement of this temperature sensor 26 as the basis for the heater 25 or chiller 29 to regulate the temperature of the tray body 21, the temperature of the semiconductor wafer W is maintained at the target temperature.

Note that, as shown in FIG. 3, in the present embodiment, each of the four test heads 32a to 32d was respectively assigned one wafer tray 20. These plurality of wafer trays 2 are configured to be able to independently adjust the temperatures of the semiconductor wafers W.

Note that, the seal member 22 in the present embodiment is equivalent to one example of the sealing means in the present invention, while the vacuum pump 282, pressure reduction passage 214, and suction hole 215 in the present embodiment are equivalent to one example of the pressure reducing means in the present invention. Further, the heater 25, chiller 29, cooling passage 216, cooling ports 241, 242, and temperature sensor 26 in the present embodiment are equivalent to one example of the temperature regulating means in the present invention.

Figure 6:
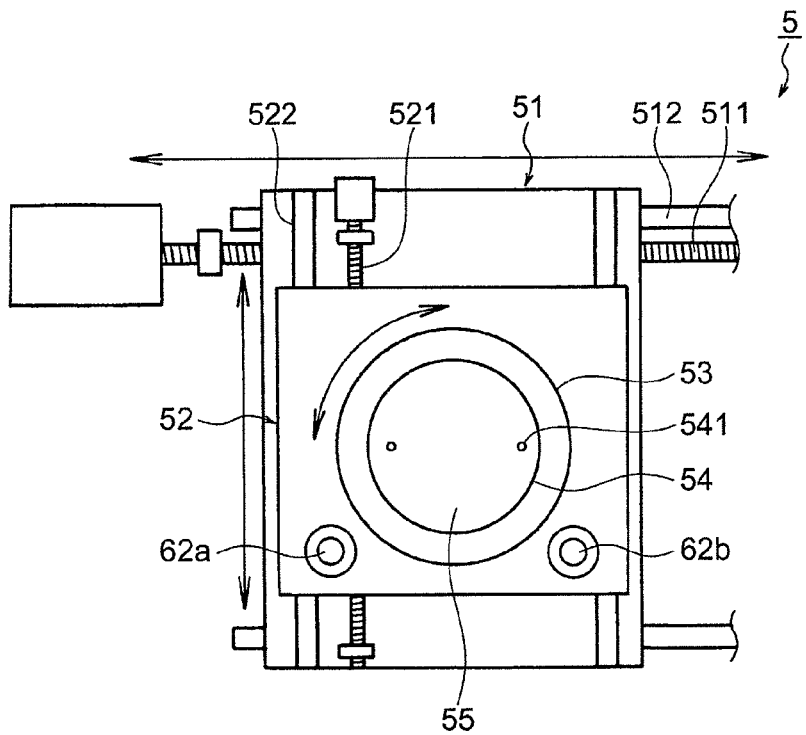
FIG. 6 is a plan view of an alignment apparatus of the semiconductor wafer test apparatus shown in FIG. 1.
Figure 7:
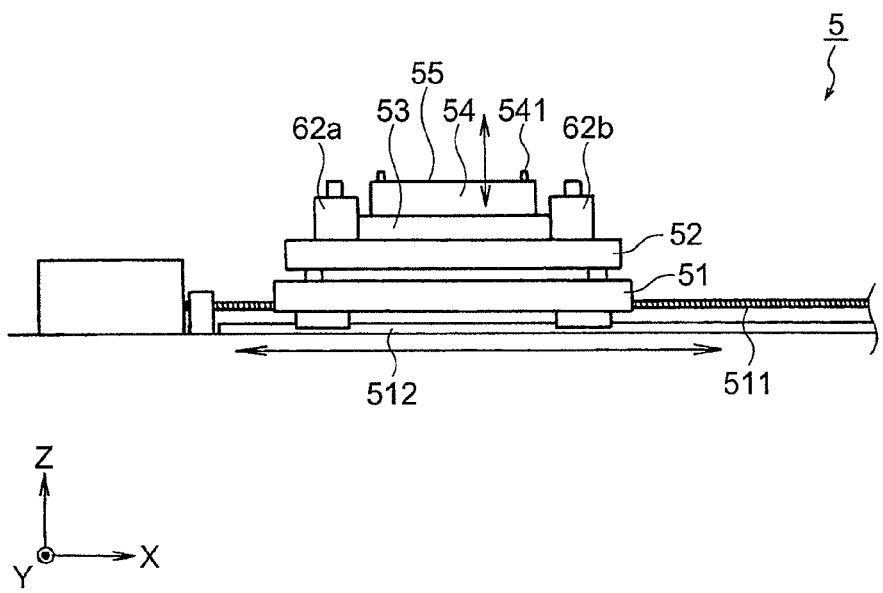
FIG. 7 is a side view of an alignment apparatus shown in FIG. 6.

FIG. 6 is a plan view of an alignment apparatus of the semiconductor wafer test apparatus shown in FIG. 1, while FIG. 7 is a side view of the alignment apparatus shown in FIG. 6.

The alignment apparatus 5 of the positioning unit 4 is an apparatus for positioning the semiconductor wafer 10 with respect to a probe card 321. As shown in FIG. 6 and FIG. 7, the alignment apparatus 5 comprises an X-direction movement mechanism 51, Y-direction movement mechanism 52, rotation mechanism 53, and elevating mechanism 54. Note that, as shown in FIG. 3, in the present embodiment, the positioning unit 4 has a single alignment apparatus 5, but the invention is not particularly limited to this. By providing the positioning unit 4 with a plurality of alignment apparatuses 5, it is possible to increase the efficiency of the work of feeding a semiconductor wafer W to the test heads 32a to 32d.

The X-direction movement mechanism 51 has: a feed mechanism 511 which comprises a ball-screw and motor; and a guide mechanism 512 which comprises a rail and guide, and enables movement along the array direction of the test heads 32a to 32d (X-direction). The X-direction movement mechanism 51 in the present embodiment is used not only to finely adjust the position of a semiconductor wafer W in the X-direction at the time of positioning, but also to move the alignment apparatus 5 itself transversely among the four test heads 32a to 32d. Note that, the alignment apparatus 5 may separately comprises: a fine adjustment mechanism for positioning the semiconductor wafer W; and a movement mechanism of the alignment apparatus 5 itself.

The Y-direction movement mechanism 52 also has: a feed mechanism 521 which comprises a ball-screw and motor; and a guide mechanism 532 which comprises a rail and guide, and enables movement along the Y-direction. This Y-direction movement mechanism 52 finely adjusts the position of a semiconductor wafer W in the Y-direction at the time of positioning.

The rotation mechanism 53 can use a not shown motor or gear to rotate the semiconductor wafer W about the Z-axis.

The elevating mechanism 54 can use a not shown ball-screw mechanism etc. to move the semiconductor wafer W up or down. A top surface 55 of this elevating mechanism 54 carries the semiconductor wafer W. Pins 541 stick out from this tray holding surface 55. These pins 541 engage with fastening holes 217 which are formed in the bottom surface of the wafer tray 2 (see FIG. 5) so as to prevent positional deviation of the semiconductor wafer W.

Note that, the X-direction movement mechanism 51, Y-direction movement mechanism 52, and rotation mechanism 53 in the present embodiment are equivalent to one example of the positioning mechanism in the present invention. Further, the X-direction movement mechanism 51 in the present embodiment is equivalent to one example of the movement mechanism in the present invention. Further, the elevating mechanism 54 in the present embodiment is equivalent to one example of the elevating mechanism in the present invention.

The first image capturing devices 61a to 61d are CCD cameras each of which captures an image of the semiconductor wafer W. As shown in FIG. 3, they are respectively provided around the mounting holes 342 of the top plate 341. The first image capturing devices 61a to 61d are provided in downwardly facing postures at the top plate 341. These first image capturing devices 61a to 61d are used for recognizing the positions of the electrode pads of the electronic circuits formed on the semiconductor wafer W. Note that, the number of the first image capturing devices is not particularly limited. One is also sufficient.

In the present embodiment, as shown in FIG. 3, the two first image capturing devices 61a, 61b which are positioned at the left side from the center of the semiconductor wafer test apparatus 1 are respectively arranged at the right sides of the mounting holes 342. As opposed to this, the two first image capturing devices 61c, 61d which are positioned at the right side from the center of the semiconductor wafer test apparatus 1 are respectively arranged at the left sides of the mounting holes 342.

By providing the plurality of first image capturing devices 61a to 61d, it is possible to shorten the distance of movement of the alignment apparatus 5 for image recognition. Further, by employing a positional arrangement such as explained above, it is possible to shorten the total length of the positioning unit 4 along the X-direction.

The second image capturing devices 62a, 62b are CCD cameras each of which captures an image of the probe card 321. As shown in FIG. 6 and FIG. 7, the second image capturing devices 62a, 62b are provided in upwardly facing postures at the Y-direction movement mechanism 52 of the alignment apparatus 5. These second image capturing devices 62a, 62b are used for recognizing the positions of the contact terminals 322 of the probe card 321 at the time of positioning the semiconductor wafer W.

In the present embodiment, the second image capturing devices 62a, 62b are arranged symmetrically in the X-direction about the elevating mechanism 54. That is, one second image capturing device 62a is arranged at the left side of the elevating mechanism 54, while the other second image capturing device 62b is arranged at the right side of the elevating mechanism 54. By providing a plurality of second image capturing devices 62a, 62b, it is possible to shorten the total length of the positioning unit 4 along the X-direction. Note that, the number of the second image capturing devices is not particularly limited. One is also sufficient.

Figure 8:
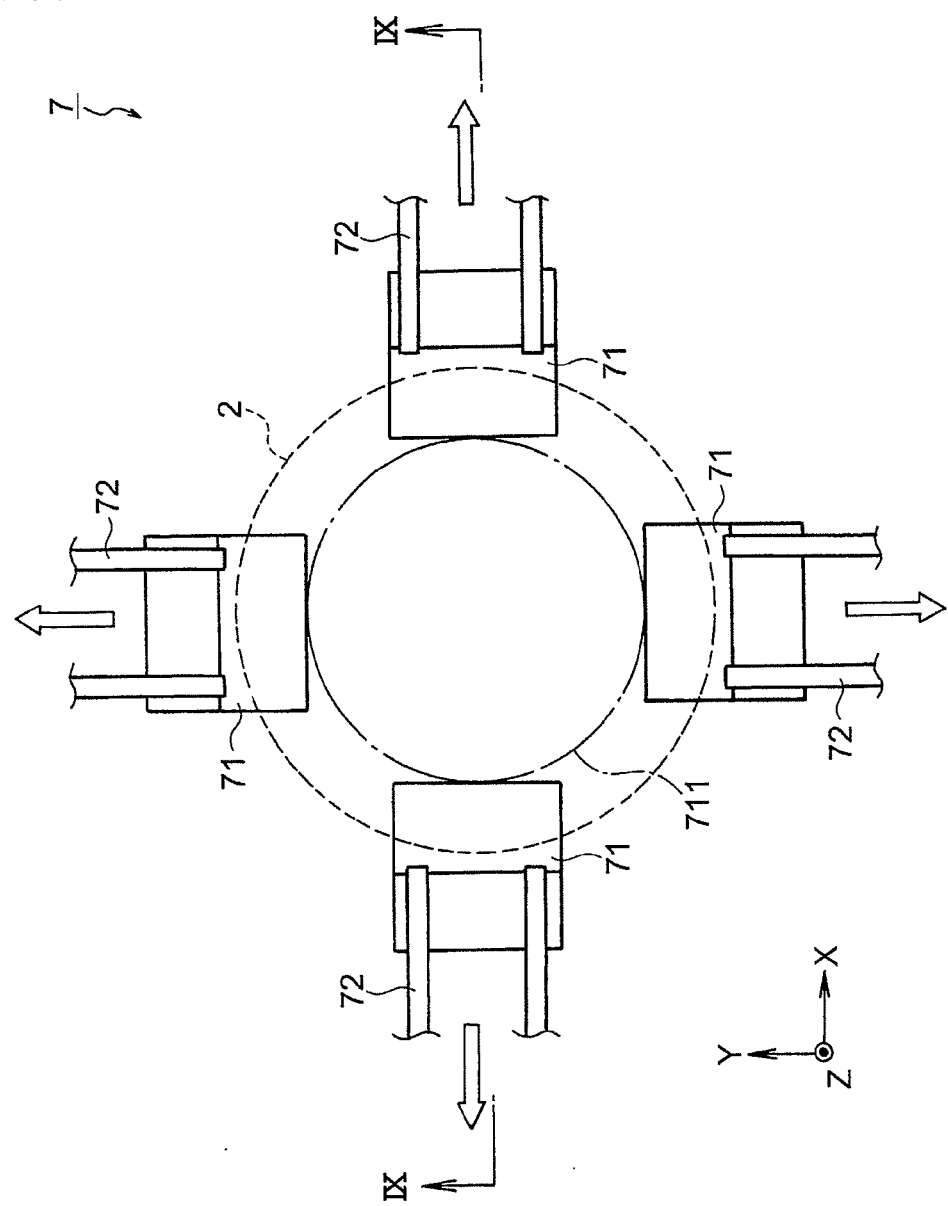
FIG. 8 is a plan view of a support device of a semiconductor wafer test apparatus shown in FIG. 1.
Figure 9:
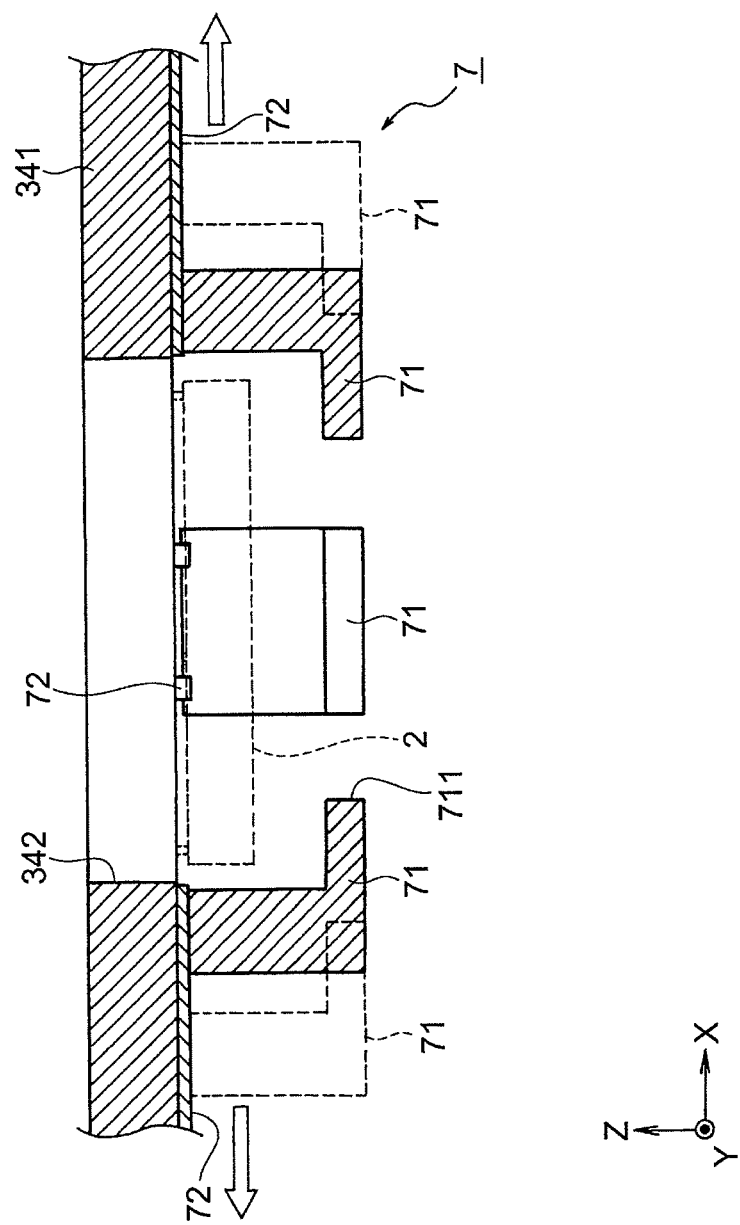
FIG. 9 is a cross-sectional view along the line IX-IX of FIG. 8.
Figure 10:
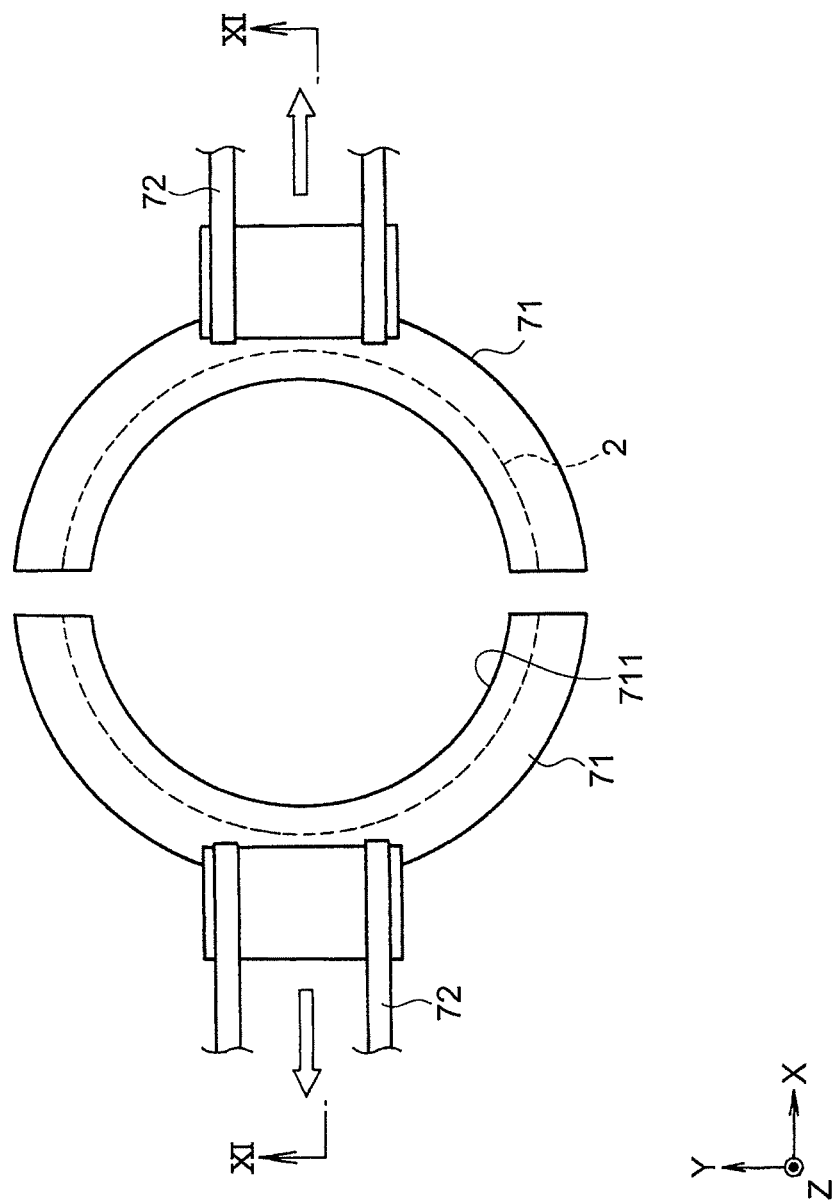
FIG. 10 is a plan view showing another example of a support device.
Figure 11:
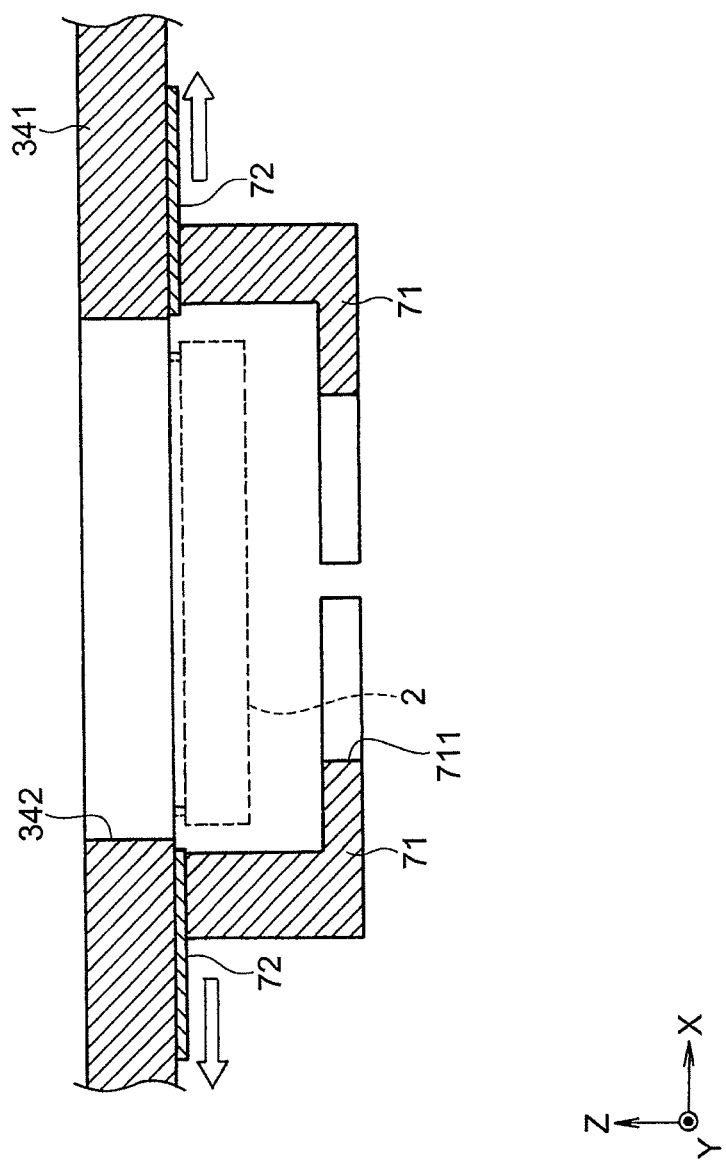
FIG. 11 is a cross-sectional view along the line XI-XI of FIG. 10.
Figure 12:
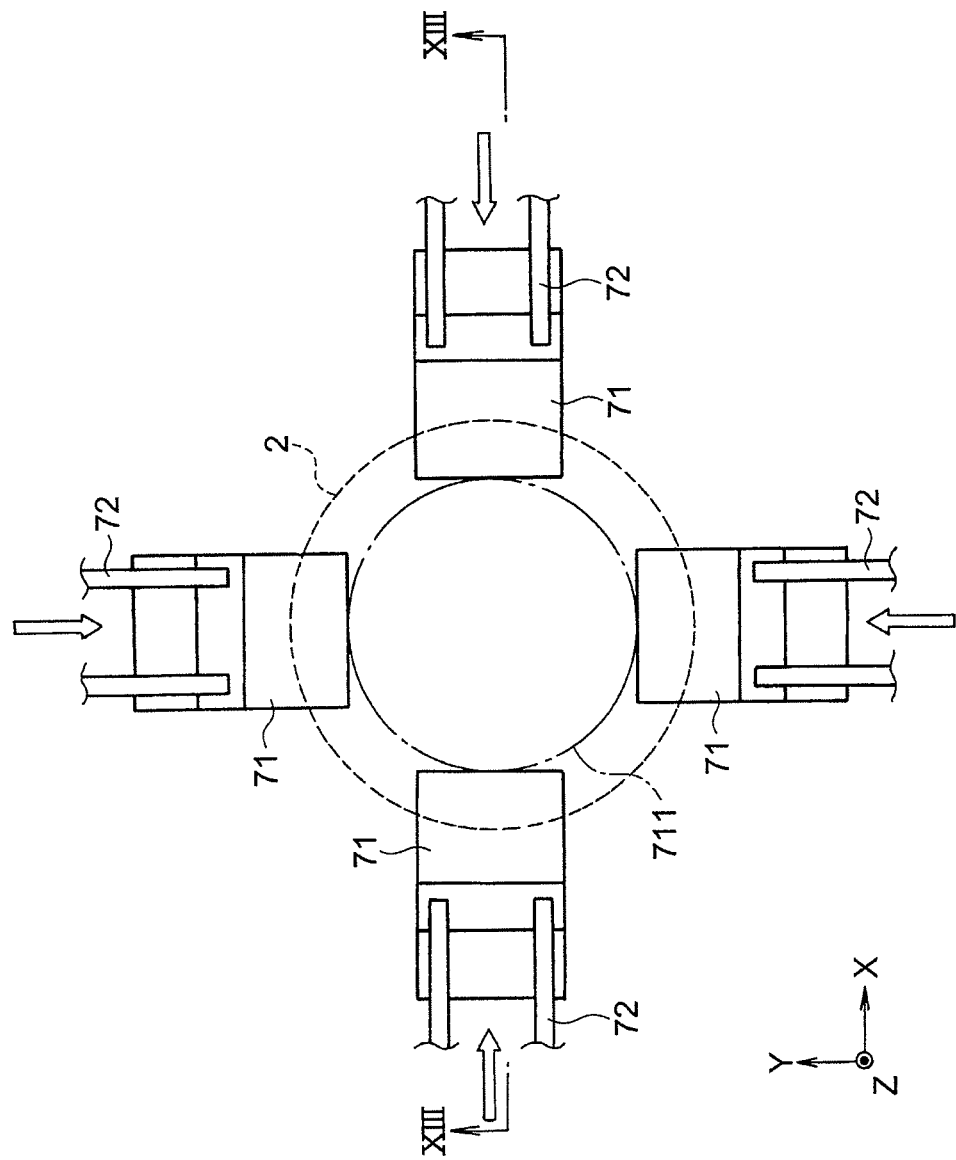
FIG. 12 is a plan view showing still another example of a support device.
Figure 13:
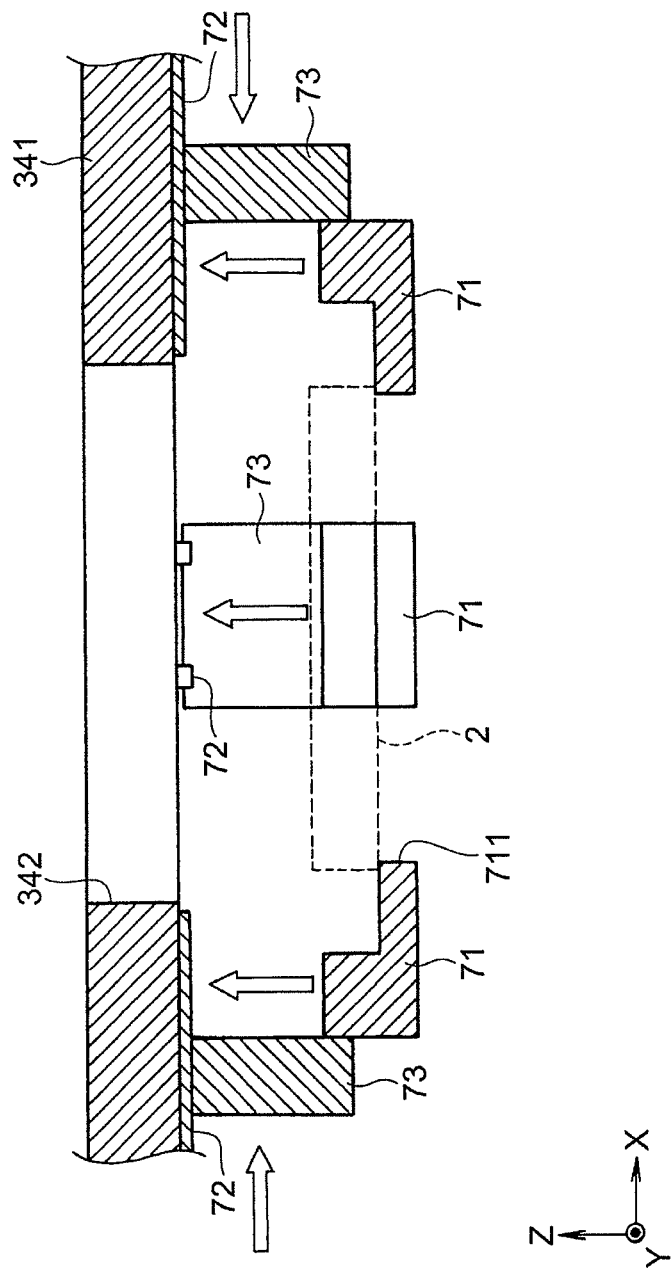
FIG. 13 is a cross-sectional view along the line XII-XII of FIG. 12.

FIG. 8 is a plan view of a support device of the semiconductor wafer test apparatus shown in FIG. 1, FIG. 9 is a cross-sectional view along the line IX-IX of FIG. 8, FIG. 10 and FIG. 11 are views showing another example of the support device, FIG. 12 and FIG. 13 are views showing still another example of the support device, and FIG. 14A to FIG. 15B are views showing further another example of the support device. Note that, FIG. 9, FIG. 11, FIG. 13, FIG. 14B, and FIG. 15B do not illustrate the probe cards 321.

The support device 7 is a device for preventing the wafer tray 2 from dropping. As shown in FIG. 8 and FIG. 9, the support device 7 has: four holders 71 which hold a wafer tray 2; and an opening/closing mechanism 72 which opens and closes the holders 71 by a motor and ball-screw mechanism. In the present embodiment, support devices 7 are respectively provided around the mounting holes 342 of the top plate 341.

The four holders 71 are configured to be able to approach/retract from each other by the opening/closing mechanism 72. In the state where these holders 71 approach each other (state shown by solid lines in FIG. 9), the inside diameter of the passage hole 711 which is formed inside of the holders 71 becomes smaller than the diameter of the wafer tray 2, so the wafer tray 2 is held by the holders 71. On the other hand, in the state where these holder 71 are retracted from each other (state shown by broken lines in FIG. 9), the inside diameter of the passage hole 711 becomes (is enlarged) larger than the diameter of the wafer tray 2, so the alignment apparatus 5 can feed and retrieve a wafer tray 2 to and from the probe card 321.

Note that the number and shapes of the holders 71 are not particularly limited. For example, as shown in FIG. 10 and FIG. 11, the holders 71 may comprise two half ring-shaped members. Further, as shown in FIG. 12 and FIG. 13, it is possible to interpose a pulling mechanism 73 between the holders 71 and opening/closing mechanism 72, the pulling mechanism uses a motor and ball-screw mechanism to pull the holders 71 toward the top plate 341. In this case, the pulling mechanism 73 can pull the wafer tray 2 toward the probe card 32, so it is possible to omit the above pressure reducing mechanism of the wafer tray 2.

Figure 14A:
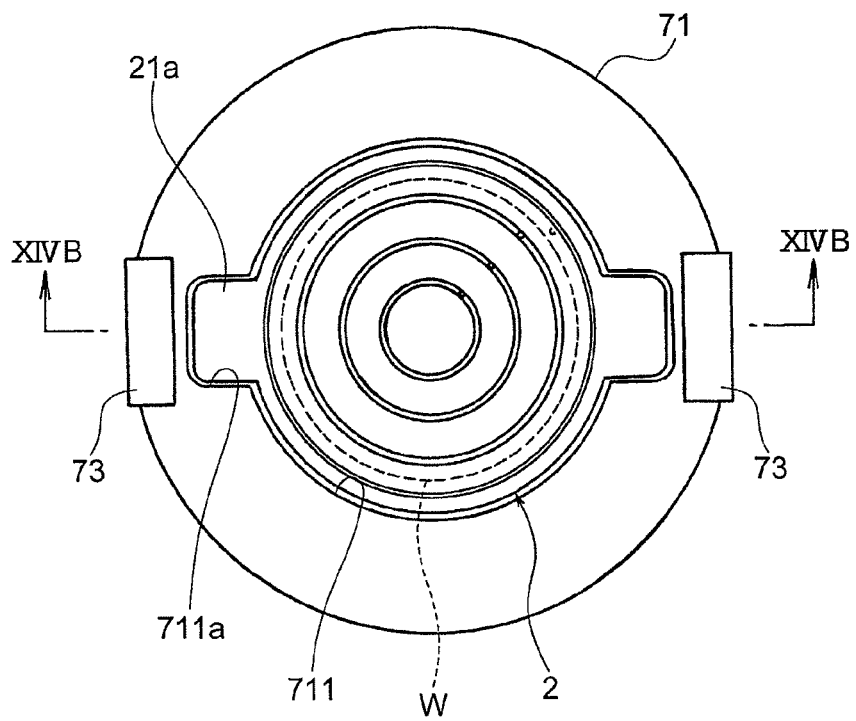
FIG. 14A is a plan view showing further another example of a support device.
Figure 14B:
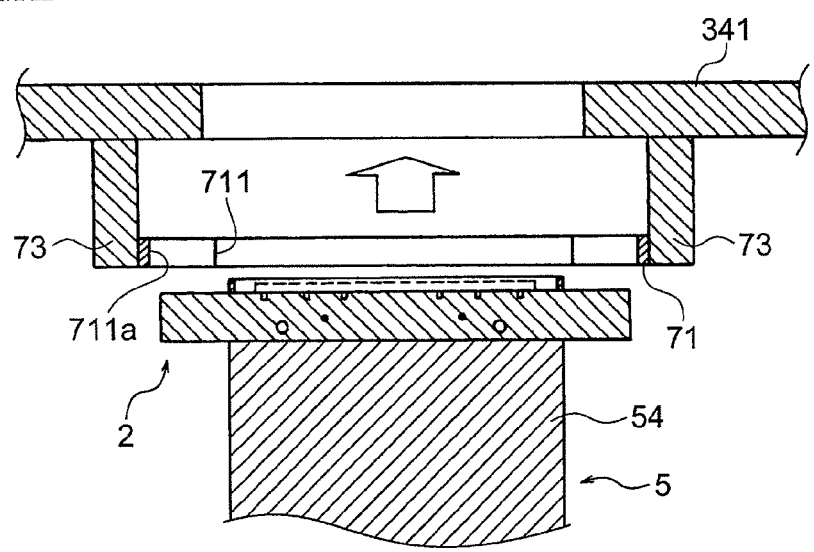
FIG. 14B is a cross-sectional view along the line XIVB-XIVB of FIG. 14A.

Furthermore, as shown in FIG. 14A and FIG. 14B, the holder 71 may comprise a single ring-shaped member. In this case, two recessed parts 711a recessed in the diametrical direction are formed on the passage hole 711 so as to face each other. Further, as shown in these figures, projecting parts 21a which correspond to the recessed parts 711a of the passage hole 711 are provided on the side surface of the wafer tray 2.

Figure 15A:
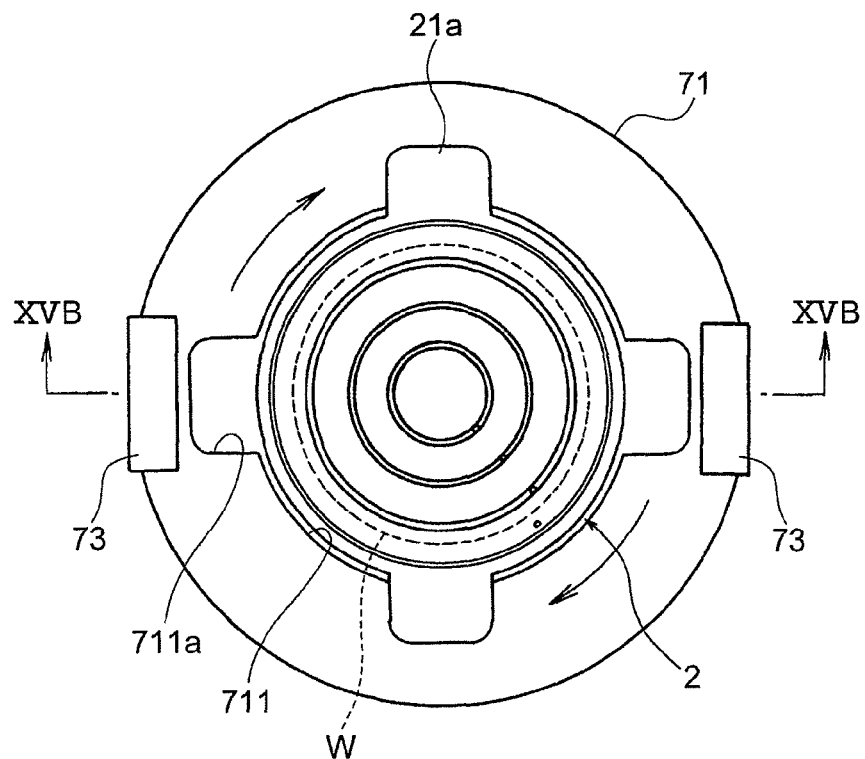
FIG. 15A is a view showing the operation of a support device shown in FIG. 14A.
Figure 15B:
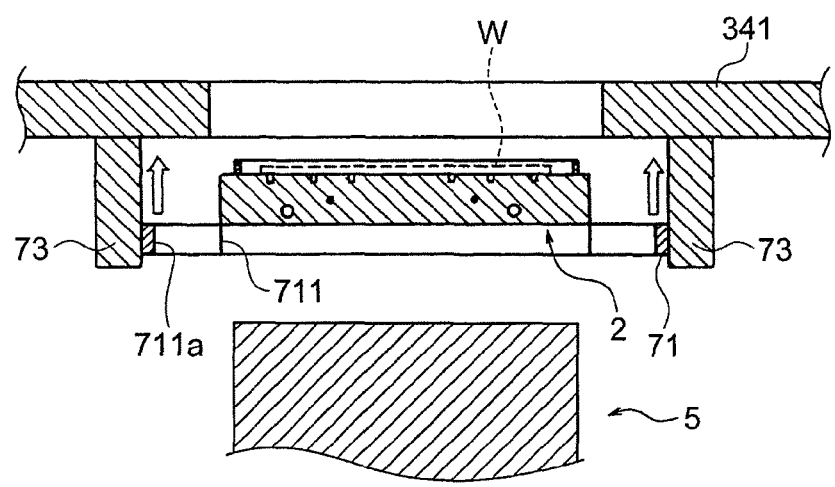
FIG. 15B is a cross-sectional view along the line XVB-XVB of FIG. 15A.

The operation of the support device of FIG. 14A and FIG. 14B will be explained referring to those drawings and FIG. 15A and FIG. 15B. First, as shown in FIG. 14A, in the state with a wafer tray 2 positioned below the holders 71, the alignment apparatus 5 positions the projecting parts 21a of the wafer tray 2 and the recessed parts 711a of the holders 71. Next, as shown in FIGS. 15A and 15B, the elevating mechanism 54 makes the wafer tray 2 ascend and pass through the passage hole 711. Next, the rotation mechanism 53 rotates the wafer tray 2, whereby the holders 71 can hold the wafer tray 2. After this, the pulling mechanism 73 can pull the wafer tray 2 toward the probe card 321 through the holders 71. In such a support device, the opening/closing mechanism 72 can be omitted. Note that, the holders 71 may be rotated with respect to the wafer tray 2.

As shown in FIG. 1 and FIG. 2, the conveyor unit 8 has: a conveyor robot 81 which handles a semiconductor wafer W between the positioning unit 4 and the storage unit 9; and a horizontal movement device 82 which moves the conveyor robot 81 along the array direction of the test heads 32a to 32d (in the present example, X-direction).

The conveyor robot 81 has: a holding part 812 which holds a semiconductor wafer W; and an arm part 811 which moves the holding part 812 in three dimensions. Specifically, a scalar robot etc. may be illustrated. Note that it is also possible to use a twin-arm type robot as the conveyor robot 81. Due to this, it would be possible to simultaneously feed and retrieve semiconductor wafers W to and from the alignment apparatus 5.

The horizontal movement device 82 has: a feed mechanism 821 which comprises a motor and a feed screw; and a guide mechanism 822 which comprises a rail and guide, and can move the conveyor robot 81 in the X-direction. Note that, as shown in FIG. 1, in the present embodiment, a single conveyor robot 81 is placed on the horizontal movement device 82, but the invention is not particularly limited to this. It is also possible to place a plurality of conveyor robots 81 on the horizontal movement device 82.

The storage unit 9, as shown in FIG. 1 and FIG. 2, has four FOUPs (Front-Opening Unified Pods) 91 (storing means) which are able to store pluralities of semiconductor wafers W. As shown in FIG. 2, pluralities of ribs 92 which face each other are formed on the inside wall surfaces of each FOUP 91. By placing the both ends of the semiconductor wafers W on these ribs 92, the semiconductor wafers W are held in the FOUP 91.

Figure 16A:
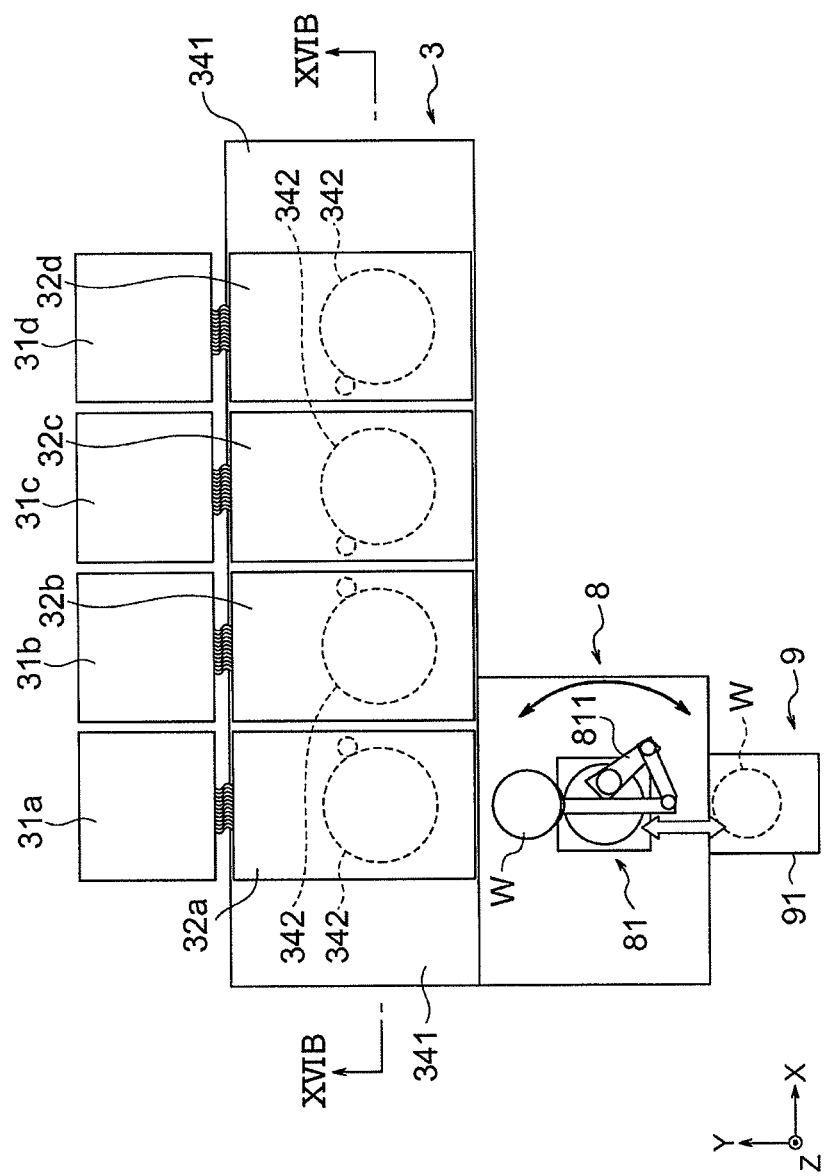
FIG. 16A is a plan view showing a semiconductor wafer test apparatus in a second embodiment of the present invention.
Figure 16B:
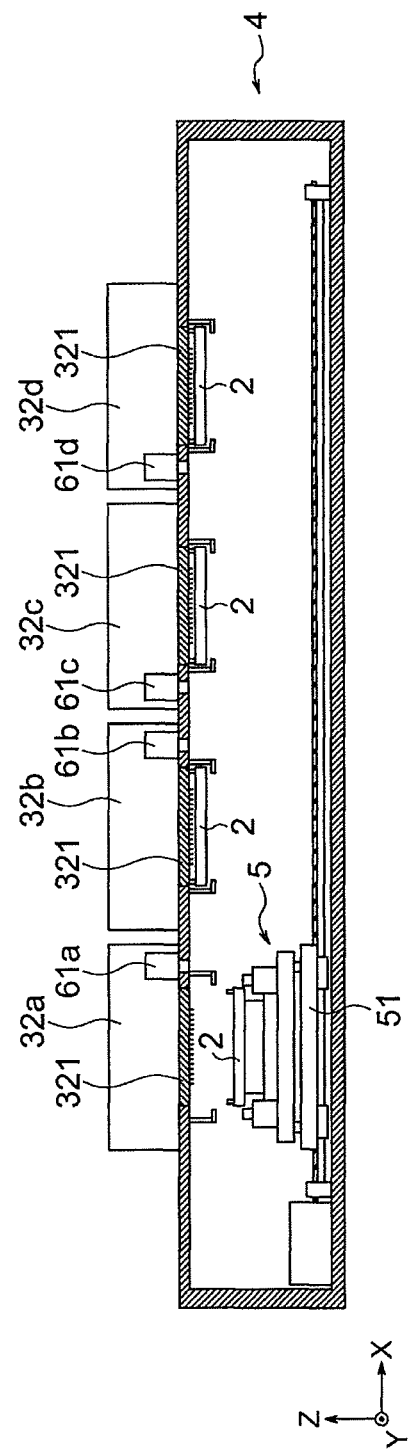
FIG. 16B is a cross-sectional view along the line XVIB-XVIB of FIG. 16A.

Note that, the number of FOUPs 91 in the storage unit 9 is not particularly limited. FIG. 16A and FIG. 16B are a plan view and a cross-sectional view showing a semiconductor wafer test apparatus in a second embodiment of the present invention. For example, as shown in FIG. 16A and FIG. 16B, it is also possible to make the number of FOUPs 91 forming the storage unit 9 a single unit. In this case, by utilizing the X-direction movement mechanism 51 of the alignment apparatus 5 to feed semiconductor wafers W to the respective test heads 32a to 32d, it is possible to eliminate the horizontal movement device 82 of the conveyor unit 8 and possible to further lower the cost.

Next, the series of operations of the semiconductor wafer test apparatus 1 in the first embodiment of the present invention will be explained with reference to FIG. 17A to FIG. 17L. FIG. 17A to FIG. 17L are views for explaining the operations of the semiconductor wafer test apparatus in the first embodiment of the present invention.

First, the alignment apparatus 5 positions the tray holding surface 55 below the test head which is to perform a test from now. In the example shown in FIG. 17A, the alignment apparatus 5 uses the X-direction movement mechanism 51 to move the tray holding surface 55 to below the left end test head 32a in the figure.

Next, as shown in FIG. 17B, the alignment apparatus 5 makes the elevating mechanism 54 rise and holds the wafer tray 2, which is in close contact with the probe card 321, by the tray holding surface 55. In this state, the vacuum pump 282 releases the vacuum of the sealed space 27. Next, the holders 71 of the support device 7 are retracted from each other by the opening/closing mechanism 72, then the elevating mechanism 54 moves the wafer tray 2 down.

Figure 17C:
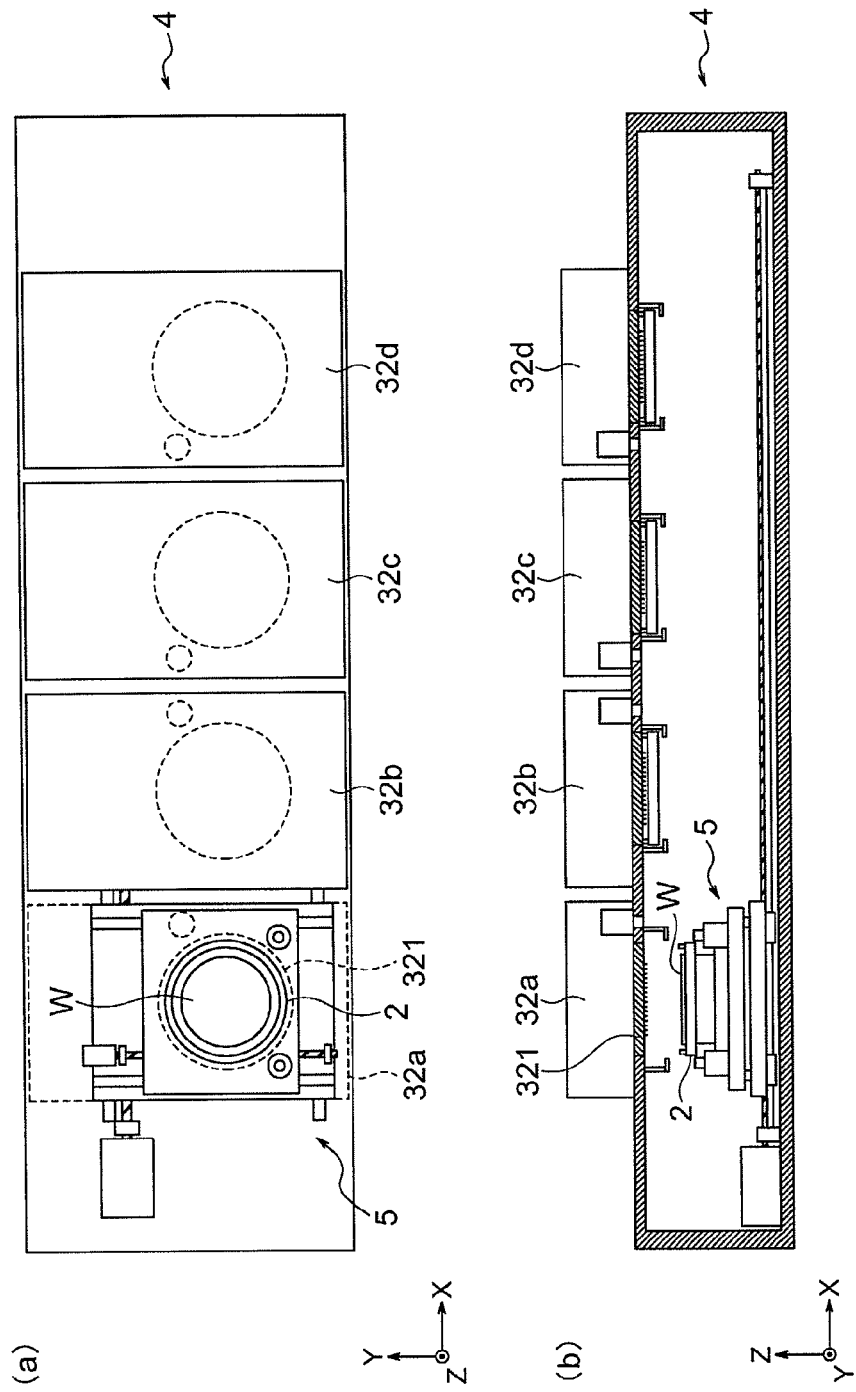
FIG. 17C is a view showing operation of a semiconductor wafer test apparatus in a first embodiment of the present invention (part 3).

Next, the conveyor robot 81 takes out a pre-test semiconductor wafer W from a FOUP 91 and feeds it to the alignment apparatus 5. At this time, the conveyor robot 81, as shown in FIG. 17C, places the semiconductor wafer W on a wafer tray 2 which is held in the alignment apparatus 5. After the semiconductor wafer W is placed on the wafer tray 2, the vacuum pump 281 is driven and the wafer tray 2 holds the semiconductor wafer W by suction.

Next, as shown in FIG. 17D, the alignment apparatus 5 drives the X-direction movement mechanism 51 and Y-direction movement mechanism 52 to position the second image capturing device 62a below the left end contact terminal 322 of the probe card 321. The second image capturing device 62a is arranged at the left side of the elevating mechanism 54. Next, the second image capturing device 62a captures an image of the left end contact terminal 322 of the probe card 321. The image processing system (not shown) processes that image date so as to recognize the position of that left end contact terminal 322.

Figure 17E:
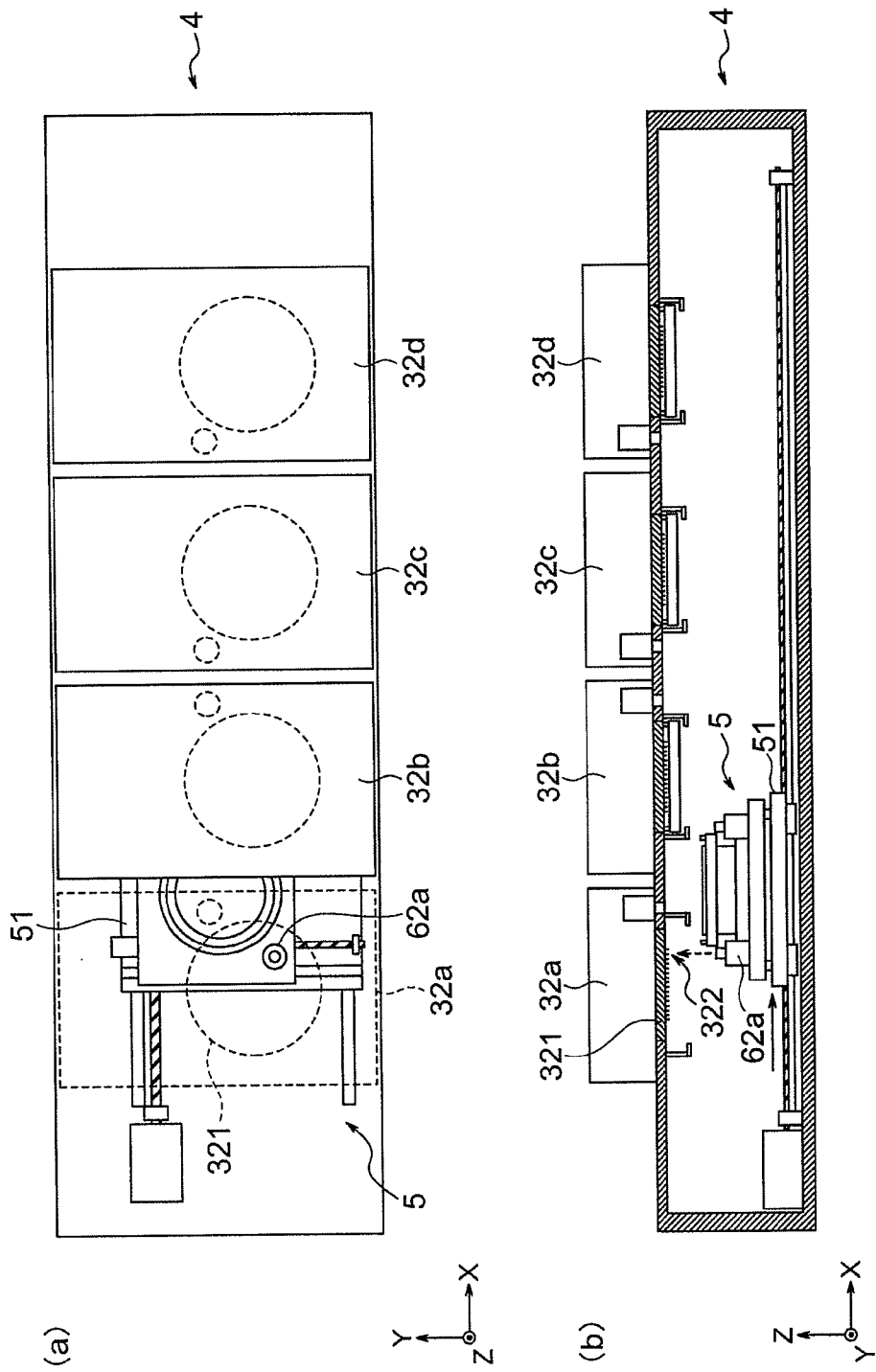
FIG. 17E is a view showing operation of a semiconductor wafer test apparatus in a first embodiment of the present invention (part 5).

Next, as shown in FIG. 17E, the alignment apparatus 5 drives the X-direction movement mechanism 51 to position the second image capturing device 62a below the right end contact terminal 322 of the probe card 321. Next, the second image capturing device 62a captures an image of the right end contact terminal 322 of the probe card 321. The image processing system processes that image date so as to recognize the position of that right end contact terminal 322.

The image processing system uses the position of the left end contact terminal 322 and the position of the right end contact terminal 322 to calculate the center (overall center) and slant (overall slant) of all of the contact terminals 322 in the probe card 321. Note that, in calculating the overall center and overall slant of the contact terminals 322, it is also possible to recognize the positions of three or more contact terminals 322.

Next, as shown in FIG. 17F, the alignment apparatus 5 drives the X-direction movement mechanism 51 and Y-direction movement mechanism 52 to position the left end electrode pad of the semiconductor wafer W below the first image capturing device 61a. Next, the first image capturing device 61a captures an image of the left end electrode pad of the semiconductor wafer W. The image processing system processed that image date so as to recognize the position of that left end electrode pad.

Figure 17G:
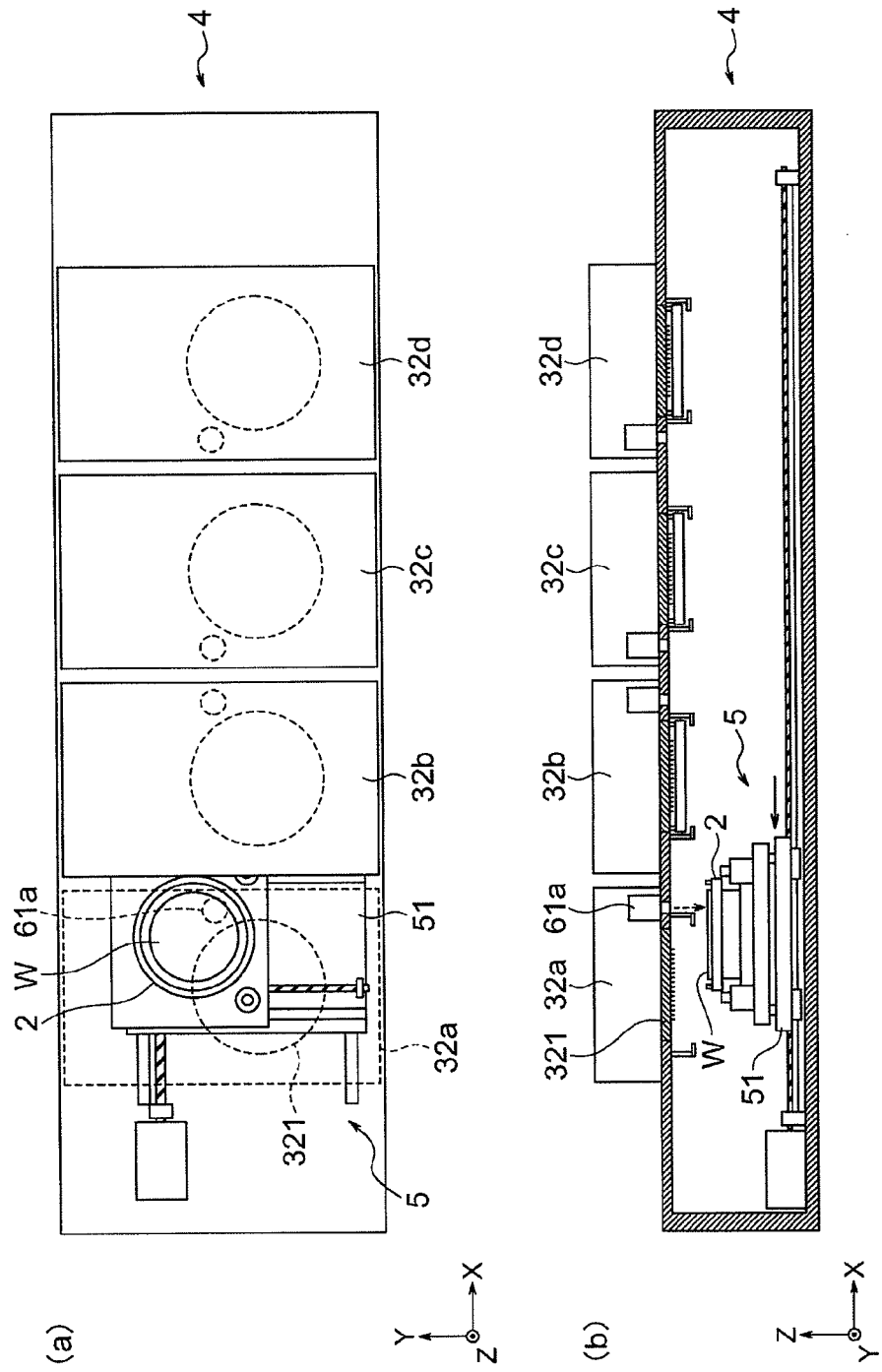
FIG. 17G is a view showing operation of a semiconductor wafer test apparatus in a first embodiment of the present invention (part 7).

Next, as shown in FIG. 17G, the alignment apparatus 5 drives the X-direction movement mechanism 51 to position the right end electrode pad of the semiconductor wafer W below the first image capturing device 61a. Next, the first image capturing device 61a captures an image of the right end electrode pad of the semiconductor wafer W. The image processing system processes that image data so as to recognize the position of that right end electrode pad.

The image processing system uses the position of the left end electrode pad and the position of the right end electrode pad to calculate the center (overall center) and slant (overall slant) of all of the electrode pads of the semiconductor wafer W. Note that, in calculating the overall center and overall slant of the electrode pads, it is also possible to recognize the positions of three or more electrode pads.

Figure 17H:
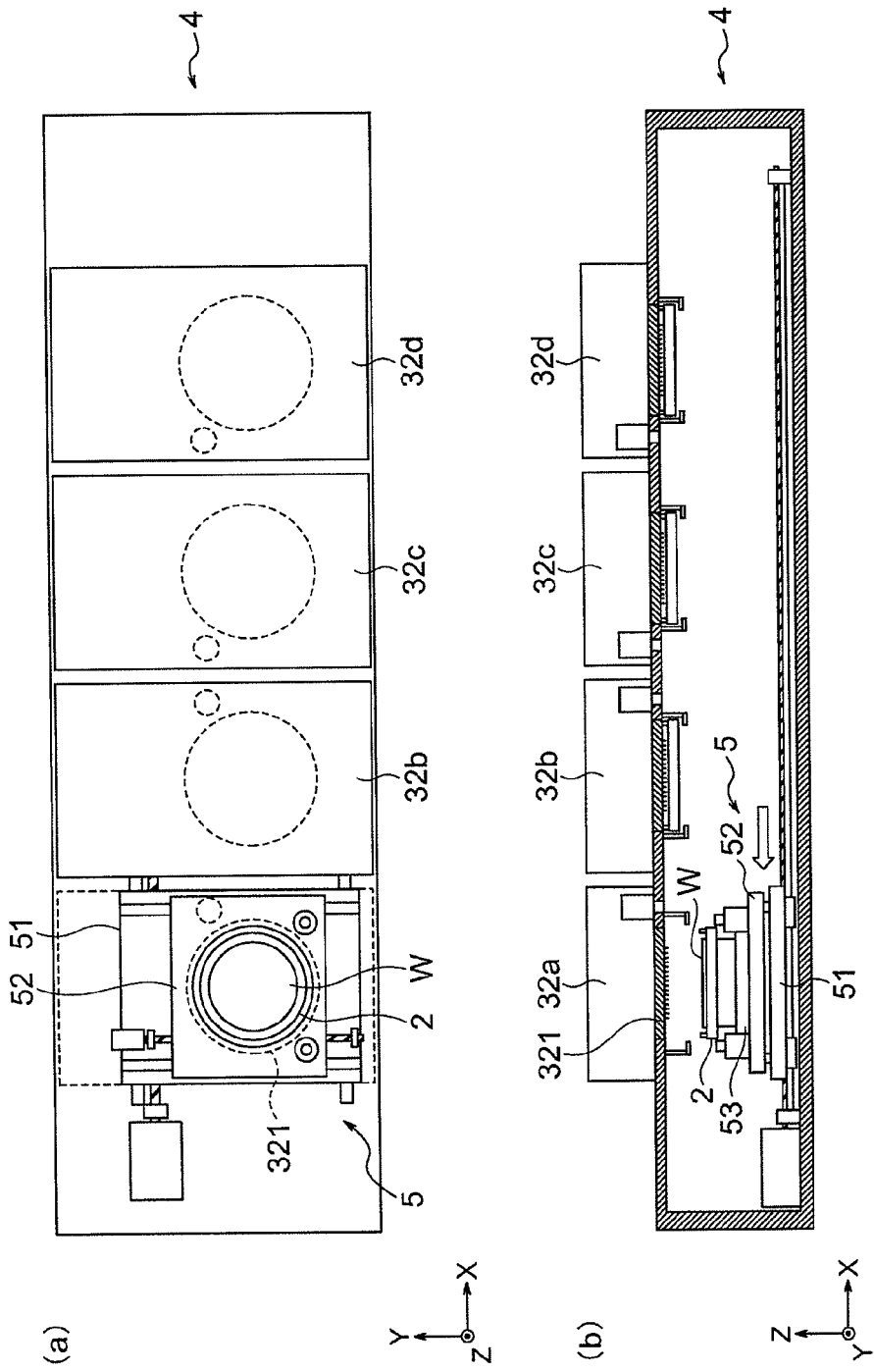
FIG. 17H is a view showing operation of a semiconductor wafer test apparatus in a first embodiment of the present invention (part 8).

After position recognition by the above image processing is finished, as shown in FIG. 17H, the alignment apparatus 5 uses the X-direction movement mechanism 51 and Y-direction movement mechanism 52 to move the semiconductor wafer W below the probe card 321. At this time, the alignment apparatus 5 uses the X-direction movement mechanism 51, Y-direction movement mechanism 52, and rotation mechanism 53 to position the semiconductor wafer W with respect to the probe card 321 so that the overall center of the contact terminals 322 and the overall center of the electrode pads match and so that the overall slant of the contact terminals and the overall slant of the electrode pads match. Note that, the method of positioning the semiconductor wafer W and a probe card 321 is not limited to the one explained above.

Figure 17I:
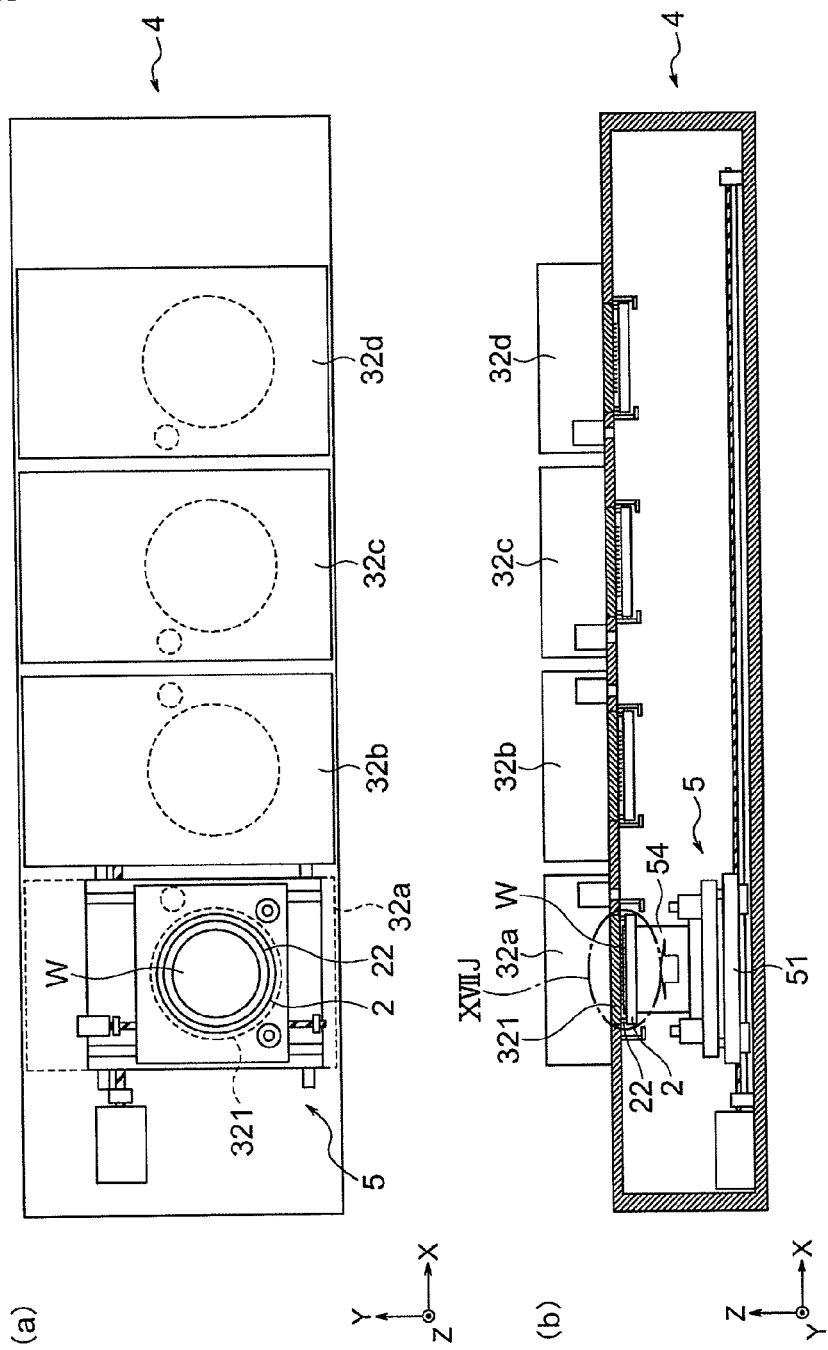
FIG. 17I is a view showing operation of a semiconductor wafer test apparatus in a first embodiment of the present invention (part 9).
Figure 17J:
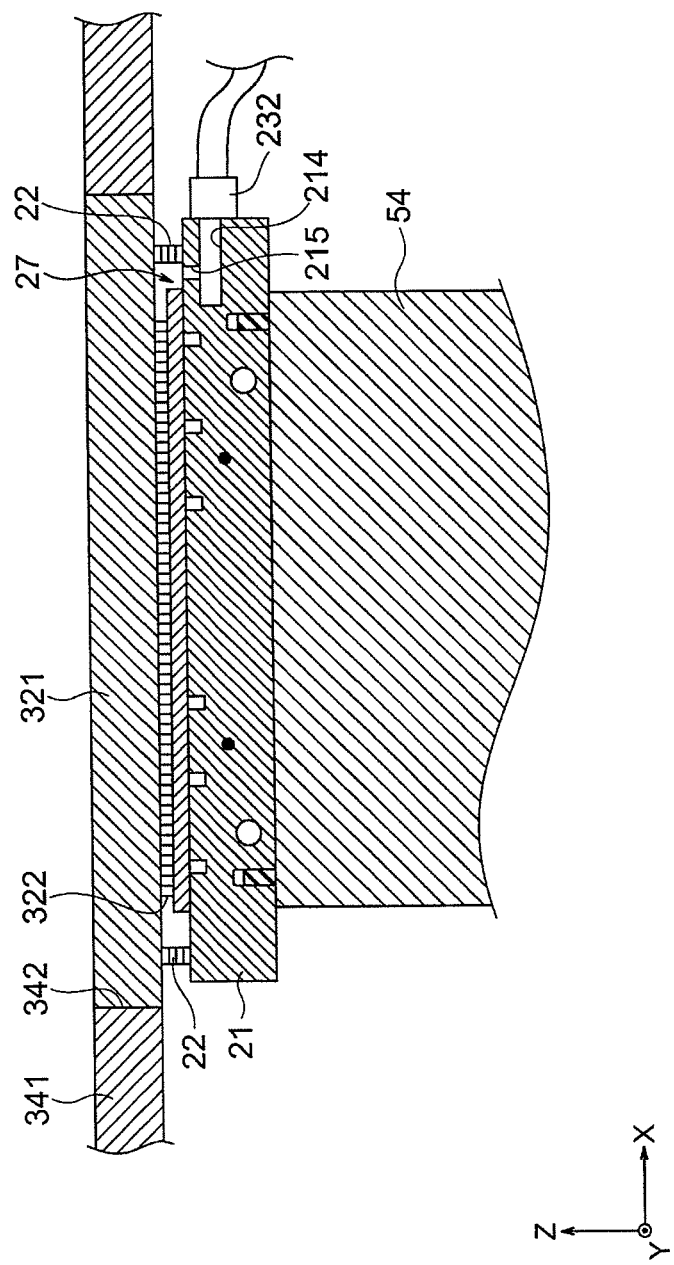
FIG. 17J is an enlarged view of a part XVIIJ of FIG. 17I.

Next, as shown in FIG. 17I, the alignment apparatus 5 uses the elevating mechanism 54 to move the semiconductor wafer W up until the seal member 22 of the wafer tray 2 closely contacts the probe card 321. When operating the vacuum pump 282 in this state, as shown in FIG. 17J, the inside of the sealed space 27 which is formed by the seal member 22 between the tray body 21 and probe card 321 is reduced in pressure and the wafer tray 2 is pulled toward the probe card 321. By reducing the pressure of the sealed space 27 by this vacuum pump 282, even if the alignment apparatus 5 separates from the semiconductor wafer W, the state of close contact between the probe card 321 and the wafer tray 2 can be maintained.

When the reduction in pressure of the sealed space 27 by the vacuum pump 282 results in the wafer tray 2 being pulled toward the probe card 321, the semiconductor wafer W which is held on that tray 2 is pushed against the probe card 321 whereby the electrode pads of the semiconductor wafer W and the contact terminals 322 of the probe card 321 electrically contact each other. In this state, the tester 31a inputs test signals through the test head 32a to the electronic circuits of the semiconductor wafer W and receives output so as to test the electronic circuits. Note that, the semiconductor wafer W is constantly regulated in temperature by the heater 25, chiller 29, and temperature sensor 26 while being held on the wafer tray 2.

On the other hand, when the reduction in pressure of the sealed space 27 by the vacuum pump 282 results in the wafer tray 2 being held by the probe card 321, as shown in FIG. 17K, the alignment apparatus 5 makes the elevating mechanism 54 descend. Further, support device 7 makes the holders 71 approach each other by the opening/closing mechanism 72 so as to prevent the wafer tray 2 from dropping.

Next, as shown in FIG. 17L, the alignment apparatus 5 uses the X-direction movement mechanism 51 to move the tray holding surface 55 to below the adjoining test head 32b, then the semiconductor wafer W is supplied to the probe card 321 of that test head 32b according to a similar procedure as the procedure explained above.

After the work of supplying the semiconductor wafer W to the probe card 321 of the test head 32b is finished, the alignment apparatus 5 supplies the semiconductor wafer W to the probe card 321 for the other test heads 32c, 32d according to a similar procedure as the procedure explained above. Note that, in the work of feeding the wafer to the test heads 32c, 32d, when recognizing the positions of the contact terminals 322, the second image capturing device 62b which is arranged at the right side of the elevating mechanism 54 is used. Due to this, it is possible to shorten the total length of the positioning unit 4 along the X-direction.

After the test of the semiconductor wafer W is finished, the wafer tray 2 which holds that wafer W is retrieved by the alignment apparatus 5 from the probe card 321. Next, the conveyor robot 81 picks up the tested semiconductor wafer W from the wafer tray 2 on the alignment apparatus 5 and returns it to a FOUP 91.

As explained above, in the present embodiment, a single semiconductor wafer test apparatus 1 comprises a plurality of test heads 32a to 32d and can be used to run a plurality of tests. Therefore, it is possible to reduce the occupied space.

Further, the alignment apparatus 5 can move along the array direction of the test heads 32a to 32d, so the four test heads 32a to 32d can share the alignment apparatus 5 and therefore the cost of the semiconductor wafer test apparatus can be lowered.

Further, in the present embodiment, the pressure reducing mechanism provided at the wafer tray 2 is used to push a semiconductor wafer W against the probe card 321, so the alignment apparatus 5 is not required to have a high rigidity. Therefore, the semiconductor wafer test apparatus can be further reduced in cost.

Figure 18:
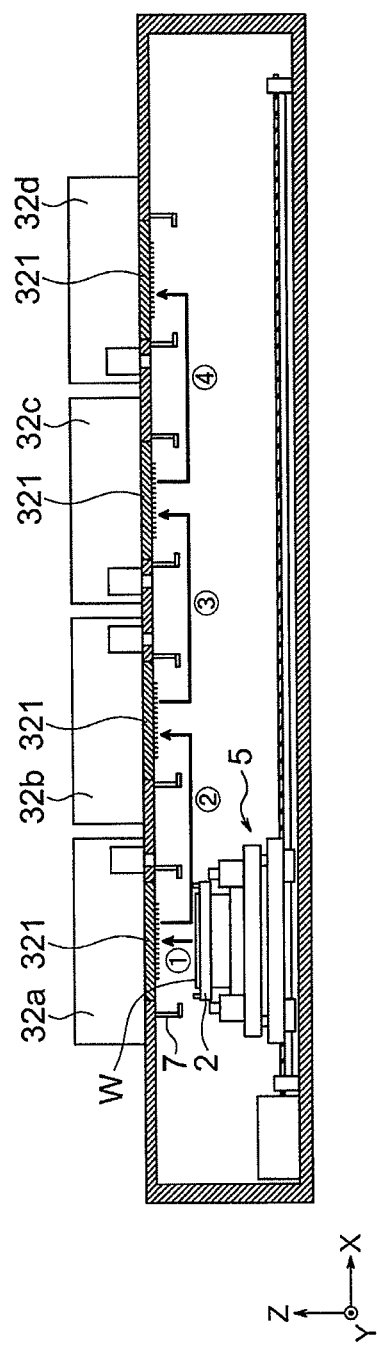
FIG. 18 is a view showing another operation of the semiconductor wafer test apparatus in a first embodiment of the present invention.

Note that, in the present embodiment, it was explained that wafer trays 2 are respectively assigned to the test heads 32a to 32d, but the invention is not particularly limited to this. For example, as shown in FIG. 18, it is also possible to use a single wafer tray 2 at four test heads 32a to 32d in a traversing manner. FIG. 18 is a view showing another operation of the semiconductor wafer test apparatus in the first embodiment of the present invention.

That is, in this operating example, the left end test head 32a in FIG. 18 tests the semiconductor wafer W, then the wafer tray 2 which holds that semiconductor wafer W is moved to the adjoining test head 32b and that test head 32b tests the semiconductor wafer W. After this, this semiconductor wafer W is also be tested by the test heads 32c and 32d.

In this way, by successively testing a single semiconductor wafer W by a plurality of test heads 32a to 32d, it is possible to run a plurality of tests on the same semiconductor wafer W in a single semiconductor wafer test apparatus. Note that, the number of wafer trays 2 in the semiconductor wafer test apparatus 1 is not particularly limited and may be one tray or several trays.

Note that, the above explained embodiments were described to facilitate understanding of the present invention and were not described for limiting the present invention. Therefore, the elements disclosed in the above embodiments include all design changes and equivalents falling under the technical scope of the present invention.

The invention claimed is:

1. A semiconductor wafer test apparatus, comprising:
    a plurality of test heads to which probe cards are electrically connected;
    a wafer tray which is able to hold a semiconductor wafer;
    an alignment device which positions the semiconductor wafer held on the wafer tray relatively with respect to the probe card so as to make the wafer tray face the probe card;
    a top plate on which a plurality of mounting holes are formed, and the probe cards being mounted in the mounting holes; and
    a pulling device which pulls the wafer tray facing the probe card toward the probe card, wherein
    the alignment device has:
        a positioning mechanism which positions the semiconductor wafer relative to the probe card; and
        a movement mechanism which moves the positioning mechanism along an array direction of the test heads,
    the pulling device has:
        at least one holder which holds the wafer tray; and
        a pulling mechanism which is provided around the mounting hole on the top plate and which pulls the holder toward the top plate side,
    the wafer tray has projecting parts which stick out in a diametrical direction such that a free end of each of the projecting parts is defined at a first diameter that is larger than a second diameter at which the fixed end of each of the projecting parts is fixed to the wafer tray,
    a passage hole which has recessed parts corresponding to the projecting parts and through which the wafer tray is capable of passing is formed on the holder, and
    the wafer tray rotates relative to the holder such that the holder holds the wafer tray.

2. The semiconductor wafer test apparatus as set forth in claim 1, wherein
the alignment device has an elevating mechanism which moves the wafer tray up and down.

3. A semiconductor wafer test apparatus, comprising:
a plurality of test heads to which probe cards are electrically connected;
a wafer tray which is able to hold a semiconductor wafer;
an alignment device which positions the semiconductor wafer held on the wafer tray relatively with respect to the probe card so as to make the wafer tray face the probe card;
a top plate on which a plurality of mounting holes are formed, and the probe cards being mounted in the mounting holes; and
a pulling device which pulls the wafer tray facing the probe card toward the probe card, wherein
the alignment device has:
a positioning mechanism which positions the semiconductor wafer relative to the probe card; and
a movement mechanism which moves the positioning mechanism along an array direction of the test heads,
the pulling device has:
at least one holder which holds the wafer tray; and
a pulling mechanism which is provided around the mounting hole on the top plate and which pulls the holder toward the top plate side, and
the pulling device has a hole enlargement mechanism which is able to enlarge a passage hole surrounded by the holders to a size through which the wafer tray is capable of passing.

4. The semiconductor wafer test apparatus as set forth in claim 1, comprising a plurality of the wafer trays, wherein
the plurality of the wafer trays respectively have temperature regulating devices which are able to mutually independently heat and/or cool the semiconductor wafers.

5. The semiconductor wafer test apparatus as set forth in claim 1, comprising at least one first image capturing device each of which captures an image of the semiconductor wafer.

6. The semiconductor wafer test apparatus as set forth in claim 5, wherein
the at least one first image capturing device is a plurality of first image capturing devices that are respectively provided adjoining the probe cards, and
one of the plurality of first image capturing devices, which is positioned at an end in the array direction of the test heads, is arranged at an inside from the probe card.

7. The semiconductor wafer test apparatus as set forth in claim 1, comprising at least one second image capturing device each of which is provided at the alignment device and which captures an image of the probe card.

8. The semiconductor wafer test apparatus as set forth in claim 7, wherein,
the at least one second image capturing device is a plurality of second image capturing devices that are arranged at both sides of the wafer tray held by the alignment device in the array direction of the test heads.

9. The semiconductor wafer test apparatus as set forth in claim 1, comprising a conveying device which conveys the semiconductor wafer to the wafer tray which is held by the alignment device.

10. The semiconductor wafer test apparatus as set forth in claim 9, comprising a storing device which is able to store the semiconductor wafer, wherein
the conveying device conveys the semiconductor wafer between the storing device and the alignment device.

11. The semiconductor wafer test apparatus as set forth in claim 1, wherein
the alignment device moves the wafer tray which faces the probe card so as to face another the probe card.

* * * * *

UNITED STATES PATENT AND TRADEMARK OFFICE
CERTIFICATE OF CORRECTION

PATENT NO.        : 9,121,901 B2
APPLICATION NO.   : 13/148971
DATED             : September 1, 2015
INVENTOR(S)       : T. Kiyokawa et al.

Page 1 of 1

It is certified that error appears in the above-identified patent and that said Letters Patent is hereby corrected as shown below:

In The Claims

Column 14, line 34 (claim 11, line 4) please change "face another the" to
-- face another --

Signed and Sealed this
Tenth Day of May, 2016

Michelle K. Lee
*Director of the United States Patent and Trademark Office*